United States Patent
Wu et al.

(10) Patent No.: US 10,811,382 B1
(45) Date of Patent: Oct. 20, 2020

(54) METHOD OF MANUFACTURING SEMICONDUCTOR DEVICE

(71) Applicant: NANYA TECHNOLOGY CORPORATION, New Taipei (TW)

(72) Inventors: Pei-Jhen Wu, Taipei (TW); Hsih-Yang Chiu, Taoyuan (TW); Chiang-Lin Shih, New Taipei (TW); Ching-Hung Chang, Taoyuan (TW); Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/404,830

(22) Filed: May 7, 2019

(51) Int. Cl.
| | | |
|---|---|---|
| *H01L 23/00* | (2006.01) | |
| *H01L 21/768* | (2006.01) | |
| *H01L 25/00* | (2006.01) | |
| *H01L 25/18* | (2006.01) | |
| *H01L 25/065* | (2006.01) | |

(Continued)

(52) U.S. Cl.
CPC .......... *H01L 24/83* (2013.01); *H01L 21/7684* (2013.01); *H01L 21/76802* (2013.01); *H01L 21/76843* (2013.01); *H01L 21/76877* (2013.01); *H01L 21/76898* (2013.01); *H01L 24/32* (2013.01); *H01L 25/0657* (2013.01); *H01L 25/18* (2013.01); *H01L 25/50* (2013.01); *H01L 21/0274* (2013.01); *H01L 21/3065* (2013.01); *H01L 21/31116* (2013.01); *H01L 21/3212* (2013.01); *H01L 23/3171* (2013.01); *H01L 24/13* (2013.01); *H01L 2224/13025* (2013.01); *H01L 2224/32146* (2013.01); *H01L 2224/83007* (2013.01); *H01L 2224/83896* (2013.01); *H01L 2225/06541* (2013.01);

(Continued)

(58) Field of Classification Search
CPC ........... H01L 25/0657; H01L 21/76877; H01L 2224/32146; H01L 2225/06541
See application file for complete search history.

(56) References Cited

U.S. PATENT DOCUMENTS

2015/0348905 A1\* 12/2015 Tsai .................. H01L 21/76898
257/774

FOREIGN PATENT DOCUMENTS

| TW | 200737410 A | 10/2007 |
| TW | 201633456 | 9/2016 |

(Continued)

*Primary Examiner* — Jay C Chang
*Assistant Examiner* — Mikka Liu
(74) *Attorney, Agent, or Firm* — Muncy, Geissler, Olds & Lowe, P.C.

(57) ABSTRACT

The present disclosure provides a method of manufacturing a semiconductor device. The method includes steps of providing a first wafer including a first substrate and a plurality of first conductors over the first substrate; forming a first interconnect structure penetrating through the first substrate and contacting one of the first conductors; forming a bonding dielectric on the first substrate and the first interconnect structure; bonding a second wafer on the first wafer, wherein the second wafer includes a second substrate, a second ILD layer on a second front surface of the second substrate, and a plurality of second conductors in the second ILD layer, wherein the second ILD layer is in contact with the bonding dielectric; forming a second interconnect structure penetrating through the second substrate and into the second ILD layer and contacting the second conductor and the first interconnect structure.

15 Claims, 28 Drawing Sheets

(51) Int. Cl.
 *H01L 23/31* (2006.01)
 *H01L 21/321* (2006.01)
 *H01L 21/027* (2006.01)
 *H01L 21/3065* (2006.01)
 *H01L 21/311* (2006.01)

(52) U.S. Cl.
 CPC ............... *H01L 2225/06565* (2013.01); *H01L 2924/1433* (2013.01); *H01L 2924/1434* (2013.01)

(56) References Cited

FOREIGN PATENT DOCUMENTS

| | | |
|---|---|---|
| TW | 201732888 A | 9/2017 |
| TW | 201735246 A | 10/2017 |
| TW | 201910832 A | 3/2019 |

\* cited by examiner

METHOD OF MANUFACTURING SEMICONDUCTOR DEVICE

TECHNICAL FIELD

The present disclosure relates to a method of manufacturing a semiconductor device, and more particularly, to a method of manufacturing a stacked integrated circuit device.

DISCUSSION OF THE BACKGROUND

As integrated circuit technologies continue to advance, ongoing efforts seek to increase performance and density, improve form factor, and reduce costs. One approach explored by designers to realize such benefits is the implementation of stacked three dimensional (3D) integrated circuits. Some areas where 3D integrated circuits are a suitable consideration include stacking of two or more chips that are fabricated using different fabrication processes, or stacking of chips that are fabricated using the same fabrication processes to reduce the footprint of the integrated circuit apparatus.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a semiconductor device. The method includes steps of providing a first wafer comprising a first substrate, a first inter-layer dielectric (ILD) layer disposed on a first front surface of the first substrate, and a plurality of first conductors disposed in the first ILD layer; forming a first interconnect structure penetrating through the first substrate and into the first ILD layer and contacting one of the plurality of first conductors; forming a bonding dielectric on a first back surface opposite to the first front surface and on the first interconnect structure; bonding a second wafer on the first wafer, wherein the second wafer comprises a second substrate, a second ILD layer disposed on a second front surface of the second substrate, and a plurality of second conductors disposed in the second ILD layer, wherein the second ILD layer is in contact with the bonding dielectric; and forming a second interconnect structure penetrating through the second substrate and into the second ILD layer and contacting one of the plurality of second conductors and the first interconnect structure.

In some embodiments, the forming of the first interconnect structure includes steps of forming a first opening penetrating through the first substrate and into the first ILD layer to expose the one of the plurality of first conductors; and depositing a first metallic material in the first opening.

In some embodiments, the forming of the second interconnect structure includes steps of forming a first trench penetrating through the second substrate, the second ILD layer and the bonding dielectric to expose the first metallic material; forming a second trench penetrating through the second substrate and into the second ILD layer to expose one of the second conductors; forming a recess communicating with the first trench and the second trench; and depositing a second metallic layer in the first trench, the second trench and recess.

In some embodiments, the method further includes steps of depositing a first insulating layer along the first back surface and the first opening before the deposition of the first metallic material; removing a portion of the first insulating layer to expose the one of the first conductors; depositing a second insulating layer along a second back surface of the second substrate, the recess, the first trench, and the second trench before the deposition of the second metallic material; and removing portions of the second insulating layer to expose the one of the second conductors and the first metallic material.

In some embodiments, the method further includes steps of depositing a first barrier layer on the first insulator and the one of the first conductors before the deposition of the first metallic material; and depositing a second barrier layer on the second insulating layer and the one of the second metallic contacts before the deposition of the second metallic material.

In some embodiments, the method further includes steps of performing a first planarizing process to remove portions of the first metallic material and the first barrier layer that are above the first insulating layer; and performing a second planarizing process to remove portions of the second metallic material and the second barrier layer that are above the second insulating layer.

In some embodiments, the forming of the first interconnect structure further includes steps of forming a second opening communicating with the first opening in the first substrate before the deposition of the first metallic material; and depositing the first metallic material in the second opening.

In some embodiments, the second opening has a substantially consistent diameter, and the first opening has a diameter that gradually decreases at positions of increasing distance from the first back surface, wherein the diameter of the first opening is less than the diameter of the second opening.

In some embodiments, the first opening has a central line, which is offset from a central line of the second opening.

In some embodiments, the method further includes steps of depositing a passivation layer over the second back surface, and forming an external contact in contact with the second interconnect structure.

In some embodiments, the method further includes steps of providing a carrier wafer before providing the first wafer; forming a forming a bonding layer on the carrier wafer; and bonding the first wafer on the carrier wafer, wherein the first ILD layer is in contact with the bonding layer.

In some embodiments, the method further includes a step of thinning the first substrate after bonding the first wafer to the carrier wafer.

In some embodiments, the method further includes a step of grinding the carrier wafer after the forming of the second metallic structure.

In some embodiments, the first interconnect structure includes a mesa, and a protrusion extending from the mesa and contacting the first conductor.

In some embodiments, the second interconnect structure includes a base, a first leg extending from the base and contacting the one of the second conductors, and a second leg extending from the base and contacting the first interconnect structure.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
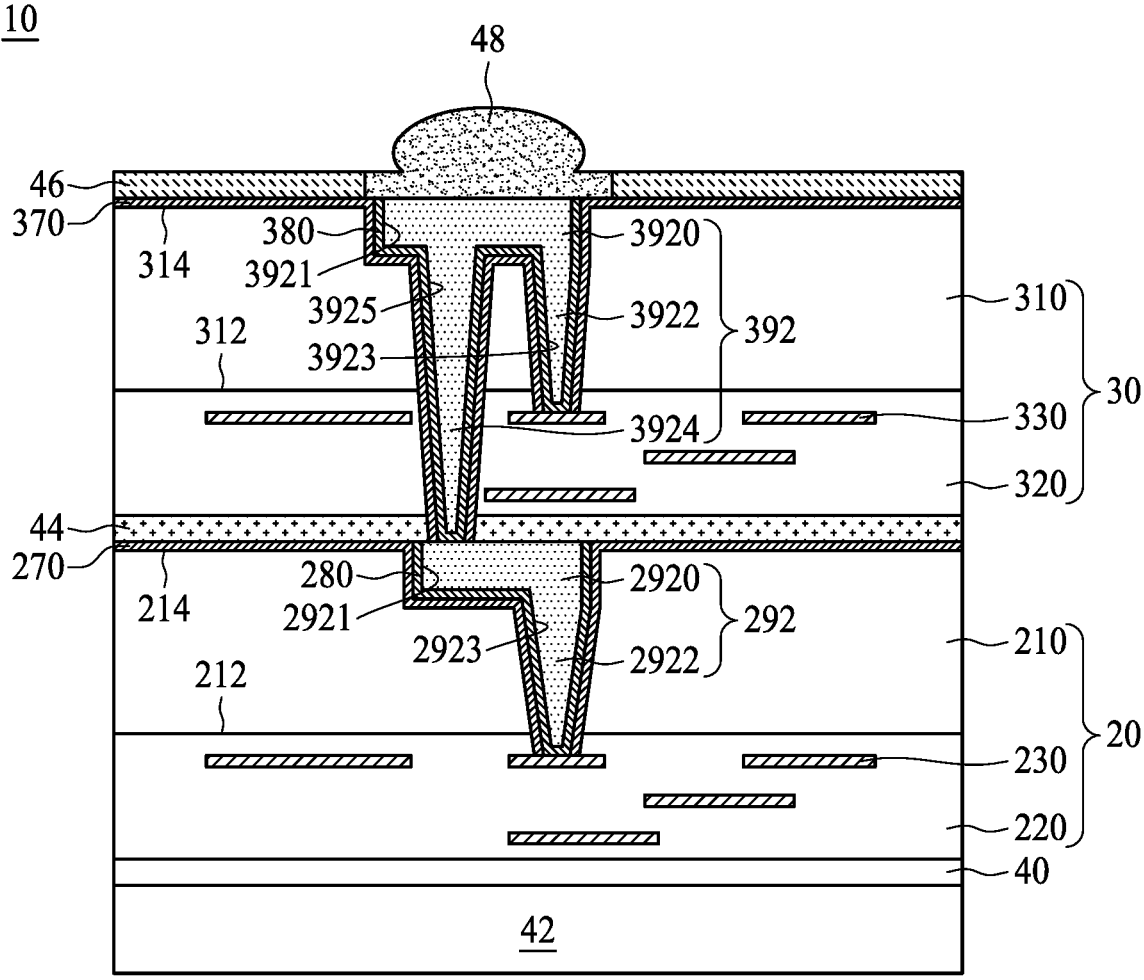
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 10 in accordance with some embodiments of the present disclosure. Referring to FIG. 1, the semiconductor device 10 includes a first wafer 20 and a second wafer 30 stacked and bonded to a top of the first wafer 20. In some embodiments, the first wafer 20 and the second wafer 30 may be fabricated using the same fabrication process. For example, the first wafer 20 and the second wafer 30 may form a memory stack. In some embodiments, the first wafer 20 and the second wafer 30 may be fabricated using different fabrication processes. For example, one of the first wafer 20 and the second wafer 30 may be a memory device and the other of the first wafer 20 and the second wafer 30 may be a processor, an image sensor or an application-specific integrated circuit (ASIC) device.

The first wafer 20 and the second wafer 30 may be bonded using a dielectric-to-dielectric bonding process. For example, the second wafer 30 is bonded on the first wafer 20 by an oxide-to-oxide bonding process. In some embodiments, a back surface 214 of the first wafer 20 may be coated with one or more bonding dielectrics 44 including oxide to provide a high-quality bonding interface. In some embodiments, the first wafer 20 may be stacked and bonded on a carrier wafer 42 by a dielectric-to-dielectric bonding process, wherein a bonding layer 40 may be sandwiched between the first wafer 20 and the carrier wafer 42 to provide a high-quality bonding interface.

In some embodiments, the first wafer 20 includes a first substrate 210 having a front surface 212 opposite to the back surface 214, a first inter-layer dielectric (ILD) layer 220 disposed on the front surface 212, and a plurality of conductors 230 disposed in the first ILD layer 220. In some embodiments, the first substrate 210 may further include various layers that are not separately depicted and that combine to form various microelectronic elements that may include transistors, resistors, diodes, capacitors, inductors, fuses, other suitable elements, or combinations thereof. The various layers may include high-k dielectric layers, gate layers, interfacial layers, diffusion/barrier layers, dielectric layers, conductive layers, other suitable layers, or combinations thereof. The various layers of the first substrate 210 may also include various doped regions, isolation features, other features, or combinations thereof. Moreover, such microelectronic elements may interconnect with one another to form a portion of the first substrate 210, such as a logic device, a memory device, a radio frequency device, an input/output device, a system-on-chip device, other suitable type of device, or combinations thereof. In some embodiments, the first ILD layer 220 covers the microelectronic elements, the doped regions and the isolation features.

The first wafer 20 further includes at least one first interconnect structure 292 penetrating through the first substrate 210 and into the first ILD layer 220 and contacting one of the first conductors 230. In some embodiments, the first interconnect structure 292 includes a mesa 2920 and a protrusion 2922 extending from the mesa 2920 and contacting the one of the first conductors 230. In some embodiments, the first interconnect structure 292 includes metal such as copper or aluminum.

In some embodiments, the first wafer 20 further includes a first insulating layer 270 extending along the first back surface 214 and attached to sidewalls 2921, 2923 of the mesa 2920 and the protrusion 2922. The first insulating layer 270 is formed to prevent diffusion spikes causing shorts across the first substrate 210 and the first interconnect structure 292.

In some embodiments, the first wafer 20 may further include a first barrier layer 280 sandwiched between the first interconnect structure 292 and the first insulating layer 270 and between the first interconnect structure 292 and the first conductor 230. In some embodiments, the first barrier layer 280 acts as a glue layer. In some embodiments, refractory metals, refractory metal nitrides, refractory metal silicon nitrides and combinations thereof are typically used for the first barrier layer 280. In some embodiments, the first barrier layer 280 may include titanium (Ti), titanium nitride (TiN), tantalum (Ta), tantalum nitride (TaN), titanium silicon nitride (TiSN), tantalum silicon nitride (TaSiN), or the like.

The second wafer 30 includes a second substrate 310, a second ILD layer 320 disposed on a front surface 312 of the second substrate 310, and a plurality of second conductors 330 disposed in the second ILD layer 320. In some embodiments, the second substrate 310 may further include various layers that are not separately depicted and that combine to form various microelectronic elements, doped regions and isolation features mentioned above. In some embodiments, the second ILD layer 320 covers the microelectronic elements, the doped regions and the isolation features.

The second wafer 30 further includes at least one second interconnect structure 392 coupled to one of the first conductors 230 to provide an external electrical connection and coupled to one of the second conductors 330 to provide an internal connection. In some embodiments, the second interconnect structure 392 includes a base 3920, a first leg 3922 extending from the base 3920 and contacting the second conductor 330, and a second leg 3924 extending from the base 3920 and contacting the first interconnect structure 292. In some embodiments, the base 3920, the first leg 3922 and the second leg 3924 are integrated and formed of material including metal such as copper or aluminum.

The second wafer 30 may further include a second insulator 370 disposed on a back surface 314 opposite the front surface 312 of the second substrate 310 and on sidewalls 3921, 3923 and 3925 of the base 3920, the first leg 3922 and the second leg 3924, respectively. The second insulating layer 370 is formed to prevent diffusion spikes causing shorts across the second substrate 310 and the second interconnect structure 392.

The second wafer 30 may further include a second diffusion layer 380 disposed between the second interconnect structure 392 and the second insulating layer 370 and between the second interconnect structure 392 and the second conductor 330.

In some embodiments, the semiconductor device 10 further includes a passivation layer 46 disposed on the second insulating layer 370 and at least one external contact 48 disposed on the second interconnect structure 292. The passivation layer 46 is used to protect the second wafer 30 from the environment.

Figure 2:
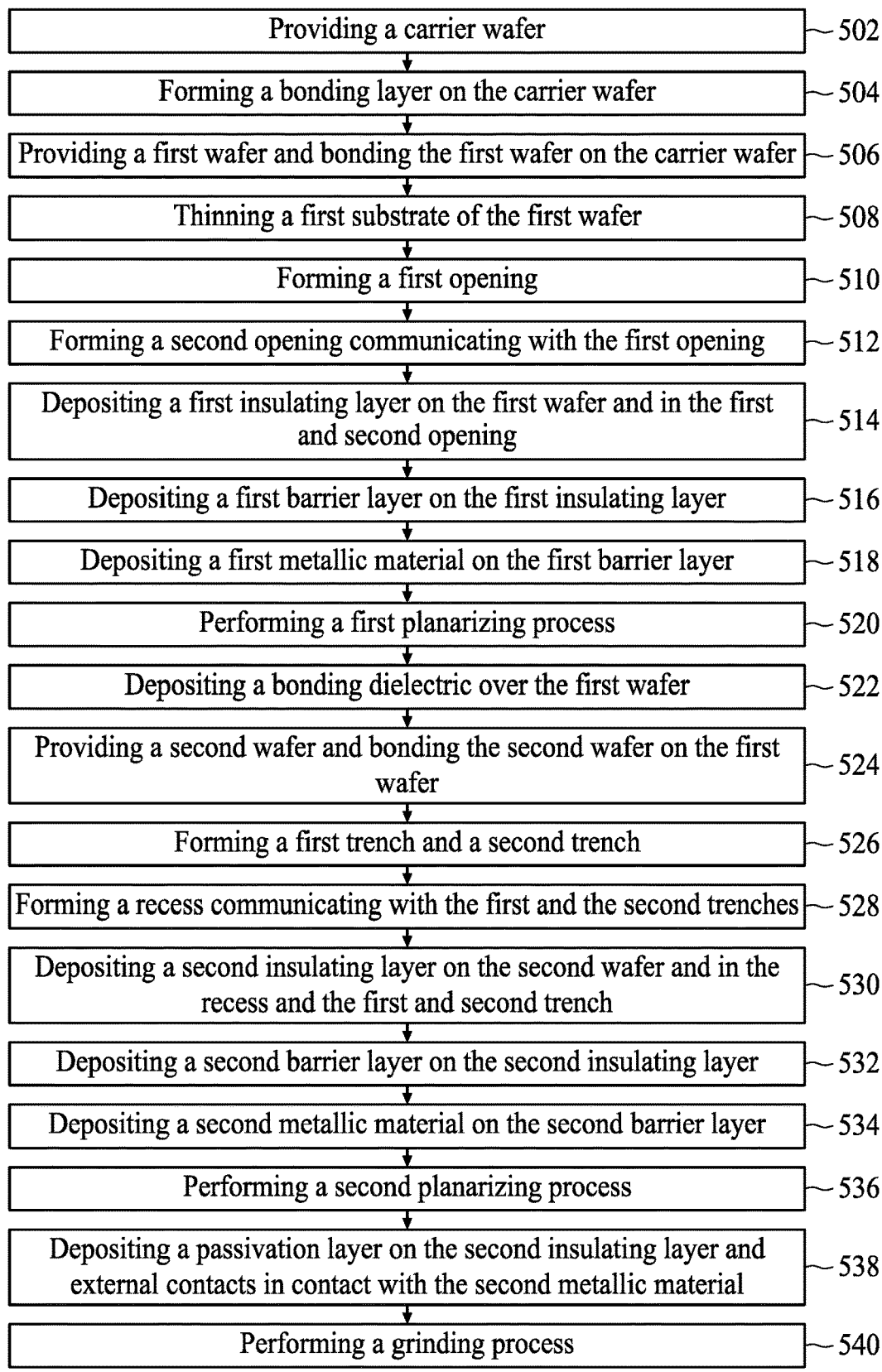
FIG. 2 is a flow diagram illustrating a method of manufacturing a package device in accordance with some embodiments of the present disclosure.

FIG. 2 is a flow diagram illustrating a method 50 of manufacturing a semiconductor device 10 in accordance with some embodiments of the present disclosure. FIGS. 3 to 28 are schematic diagrams illustrating various fabrication stages constructed according to the method 50 for manufacturing the semiconductor device 10 in accordance with some embodiments of the present disclosure. The stages shown in FIGS. 3 to 28 are also illustrated schematically in the flow diagram in FIG. 2. In the subsequent discussion, the fabrication stages shown in FIGS. 3 to 28 are discussed in reference to the process steps shown in FIG. 2.

Figure 3:
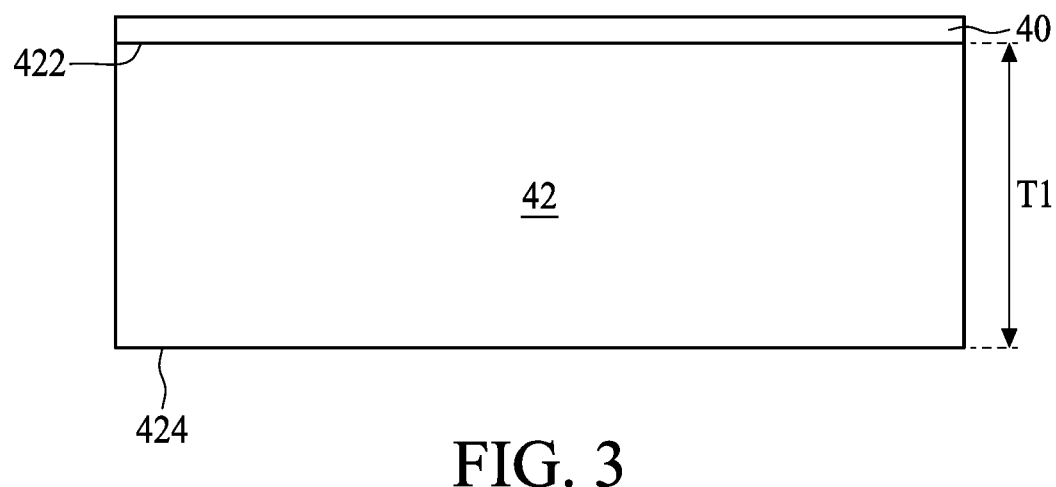
FIGS. 3 to 28 illustrate cross-sectional views of intermediate stages in the formation of a semiconductor structure in accordance with some embodiments of the present disclosure.

Referring to FIG. 3, a carrier wafer 42 is provided according to a step 502 in FIG. 2. In some embodiments, the carrier wafer 42 may be a bare silicon wafer without any electrical circuitry disposed thereon. In some embodiments, the carrier wafer 42 includes a first surface 422 and a second surface 424 opposite to the first surface 422. In some embodiments, the carrier wafer 42 has a thickness T1, which may be, for example, greater than 750 µm, such as 775 µm.

Next, a bonding layer 40 is formed on the first surface 422 according to a step 504 in FIG. 2. In some embodiments, the bonding layer 40 includes oxide, such as silicon oxide. In some embodiments, the bonding layer 40 may be formed by a thermal oxidation process or a chemical vapor deposition (CVD) process.

Figure 4:
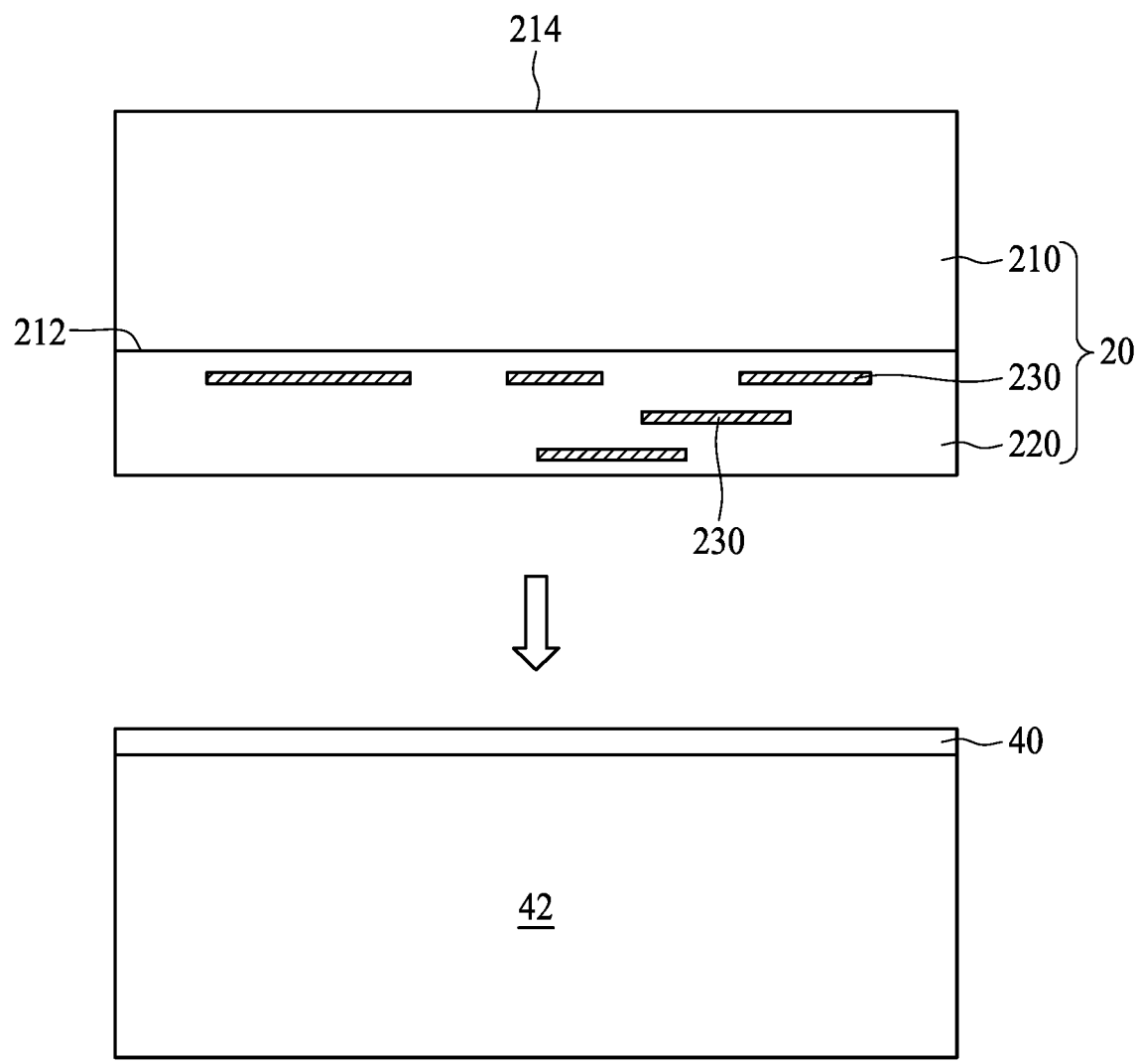
Figure 5:
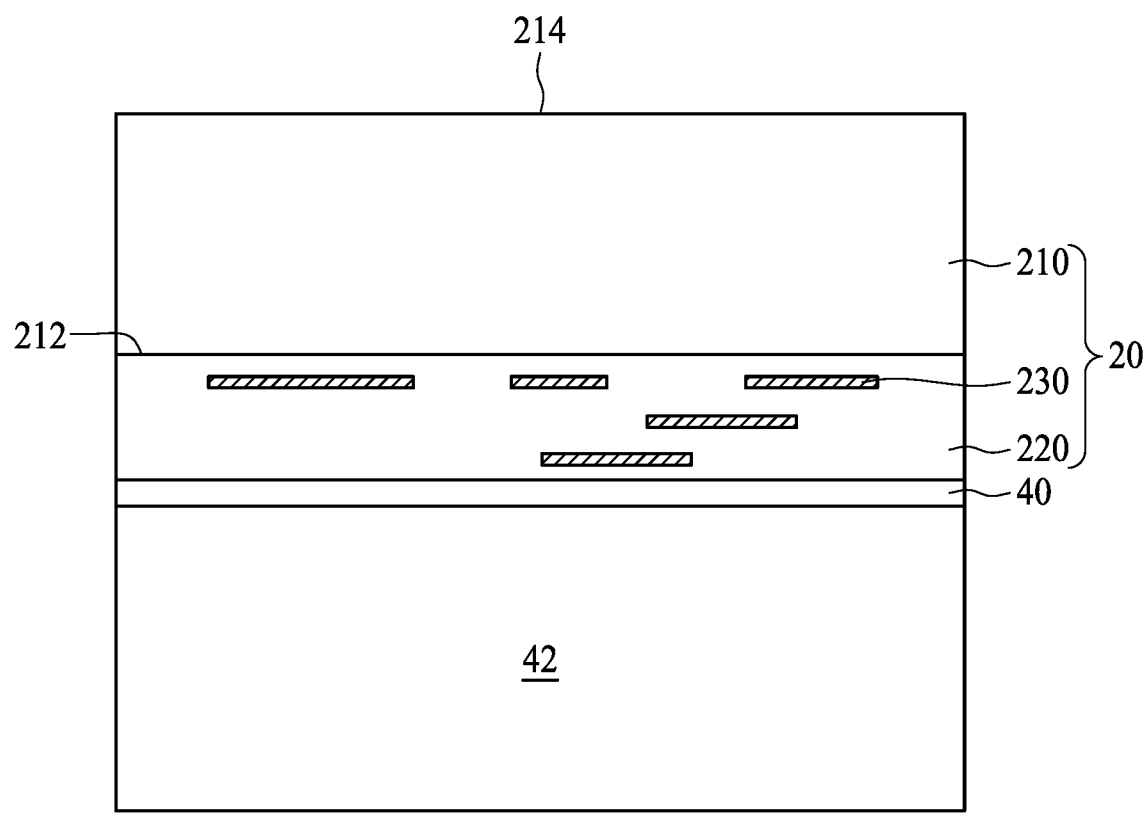

Referring to FIGS. 4 and 5, a first wafer 20 is provided and bonded on the carrier wafer 42 according to a step 506 in FIG. 2. In some embodiments, the first wafer 20 is bonded on the carrier wafer 42 by a dielectric-to-dielectric bonding process, such as an oxide fusion bonding process. In some embodiments, the first wafer 20 includes a first substrate 210, a first inter layer dielectric (ILD) layer 220 disposed on a first front surface 212 of the first substrate 210, and a plurality of first conductors 230 disposed in the ILD layer 220. After the first wafer 20 and the carrier wafer 42 are bonded, the first wafer 20 is stacked on the carrier wafer 42, and the first ILD layer 220 is in contact with the bonding layer 40. The first substrate 210 may include, for example, doped or undoped bulk silicon, or an active layer of a semiconductor-on-insulator (SOI) substrate. In some embodiments, the first substrate 210 may further include various layers that are not separately depicted and that combine to form various microelectronic elements, doped regions and isolation features, wherein the first ILD layer 220 is disposed over the microelectronic elements, the doped regions and the isolation features.

Figure 6:
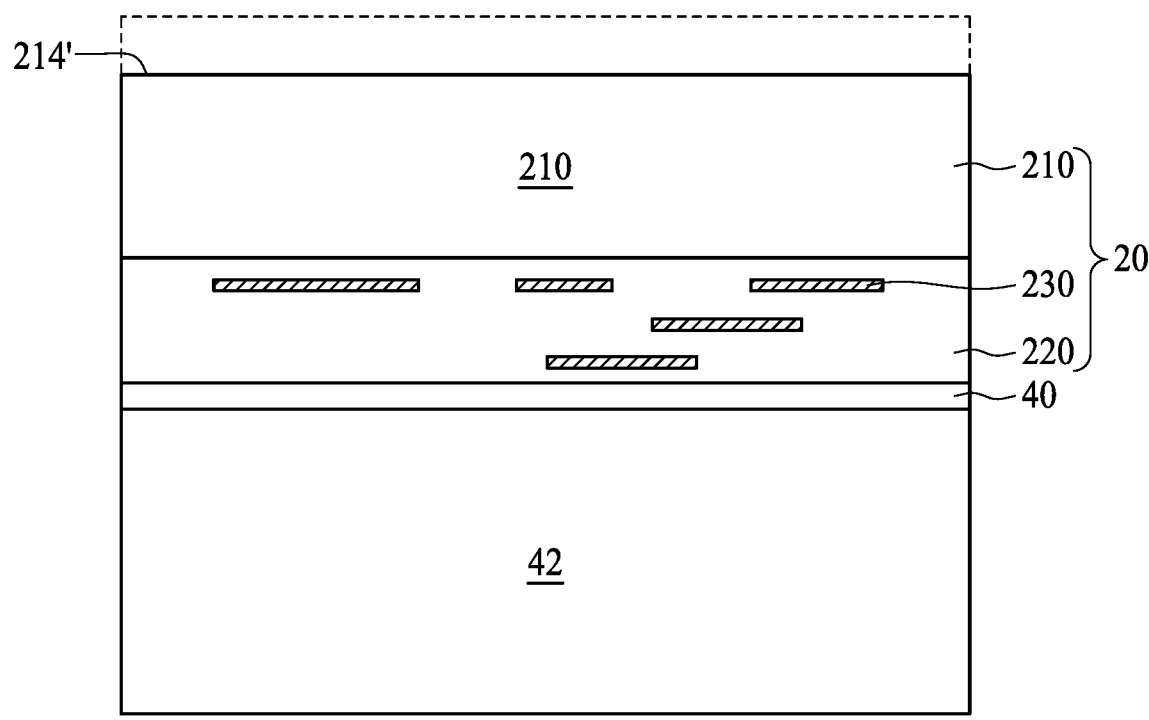

Referring to FIG. 6, a thinning process may be performed to thin the first wafer 20 according to a step 508 in FIG. 2. Accordingly, a first back surface 214' is exposed. In some embodiments, the thinning process is performed on an initial back surface 214 (shown in FIGS. 4 and 5), opposite to the front surface 212, to thin the first substrate 210. In FIG. 6, the dotted line marks an original thickness of the first substrate 210. The thinning process may be implemented using suitable techniques such as a grinding process, a polishing process and/or a chemical etching process.

Figure 7:
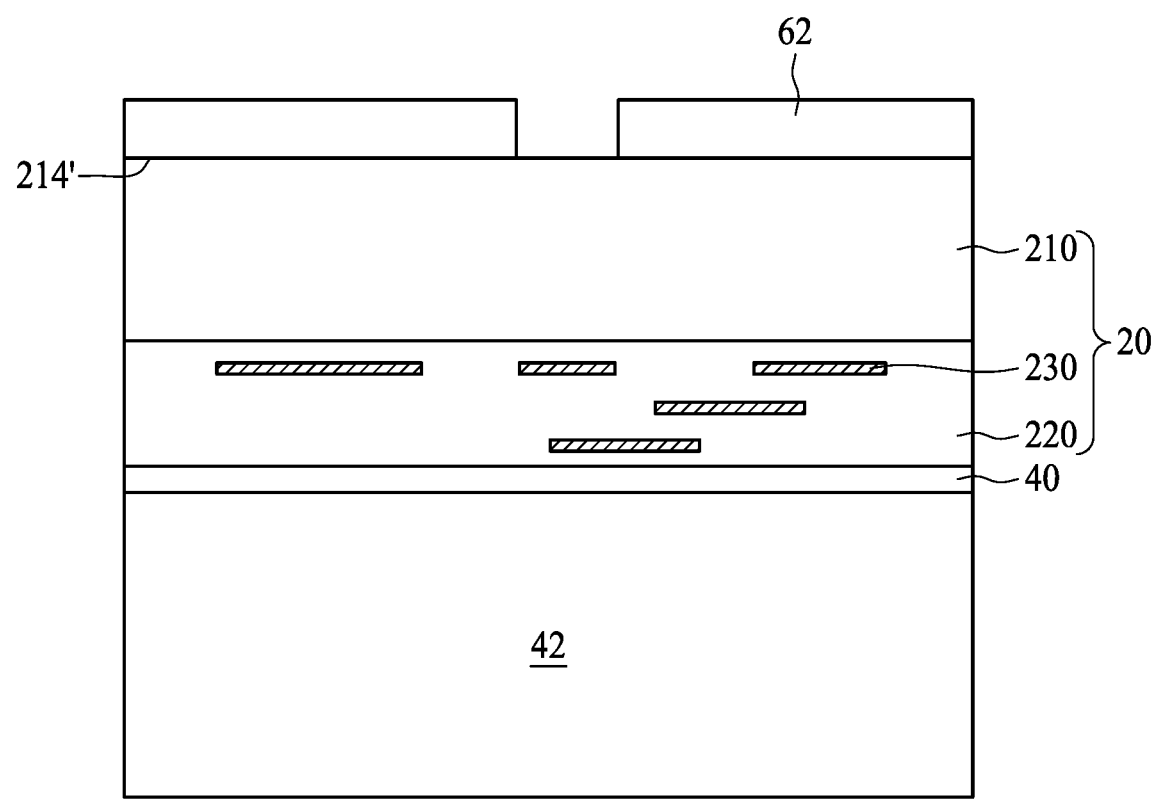
Figure 8:
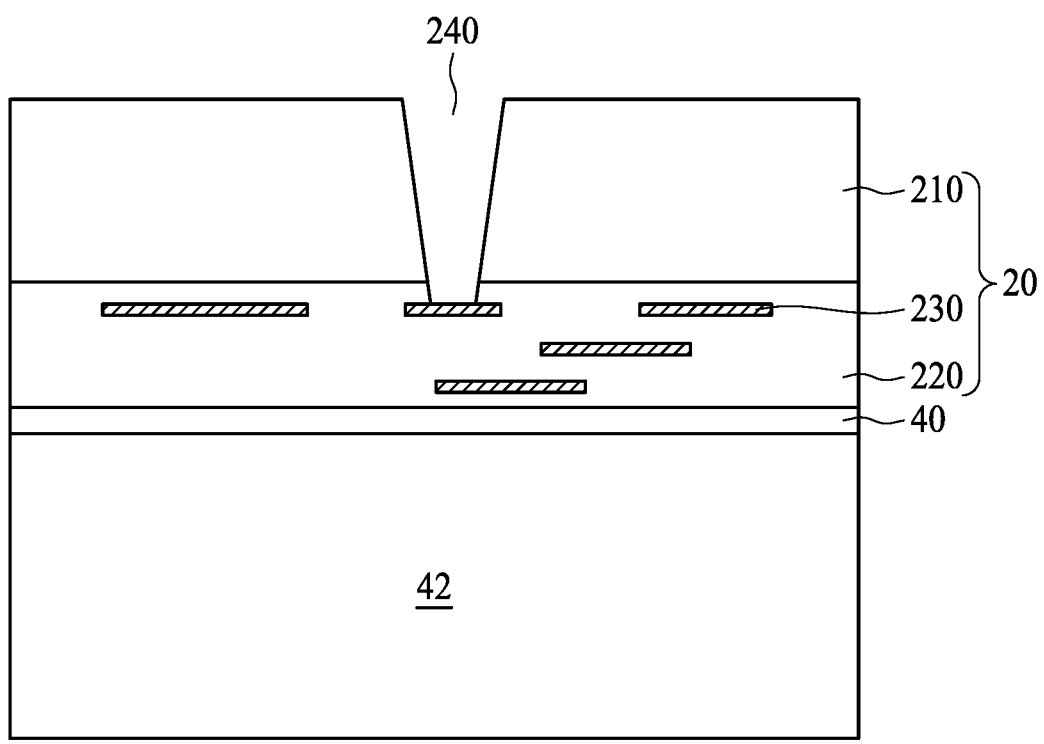

Referring to FIGS. 7 and 8, in some embodiments, a first opening 240 is formed to expose one of the first contacts 230 according to a step 510 in FIG. 2. In some embodiments, the first opening 240 is formed by coating a first photoresist pattern 62 on the first back surface 214' and performing a first etching process to remove portions of the first substrate 210 and the first ILD layer 220. In some embodiments, the first photoresist pattern 62 may be formed by performing an exposure process and a develop process on a first photoresist material fully covering the first back surface 214'. In some embodiments, a portion of the first back surface 214' to be etched is exposed through the first photoresist pattern 62. In some embodiments, the first opening 240 stops at one of the first contacts 230. In some embodiments, the first etch process may utilize multiple etchants to etch the first substrate 210 and the first ILD layer 220, wherein the etchants are selected based on the materials being etched. In some embodiments, the first substrate 210 and the first ILD layer 220 may be etched using a dry etching process, an anisotropic wet etching process, or any other suitable anisotropic etching process. After the first etching process, the first photoresist pattern 62 is removed, for example, by an ashing process or a wet strip process, wherein the wet strip process may chemically alter the first photoresist pattern 62 so that it no longer adheres to the first substrate 210.

Figure 9:
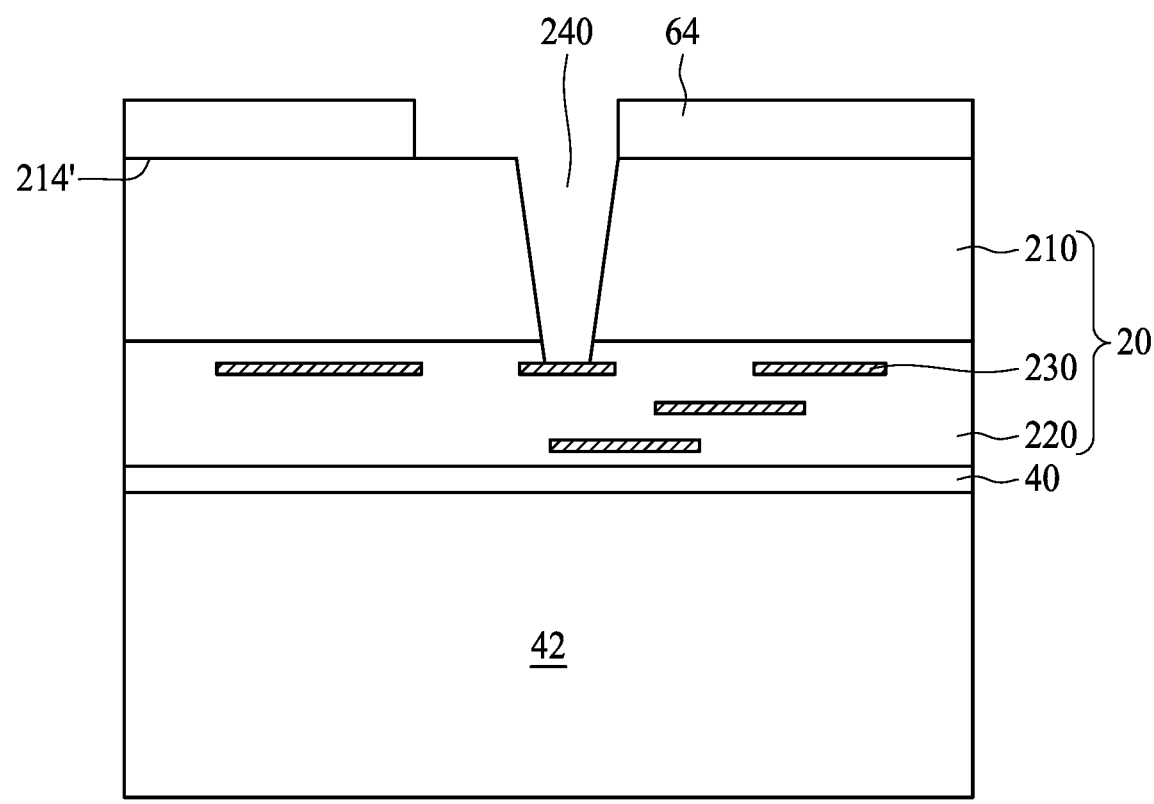
Figure 10:
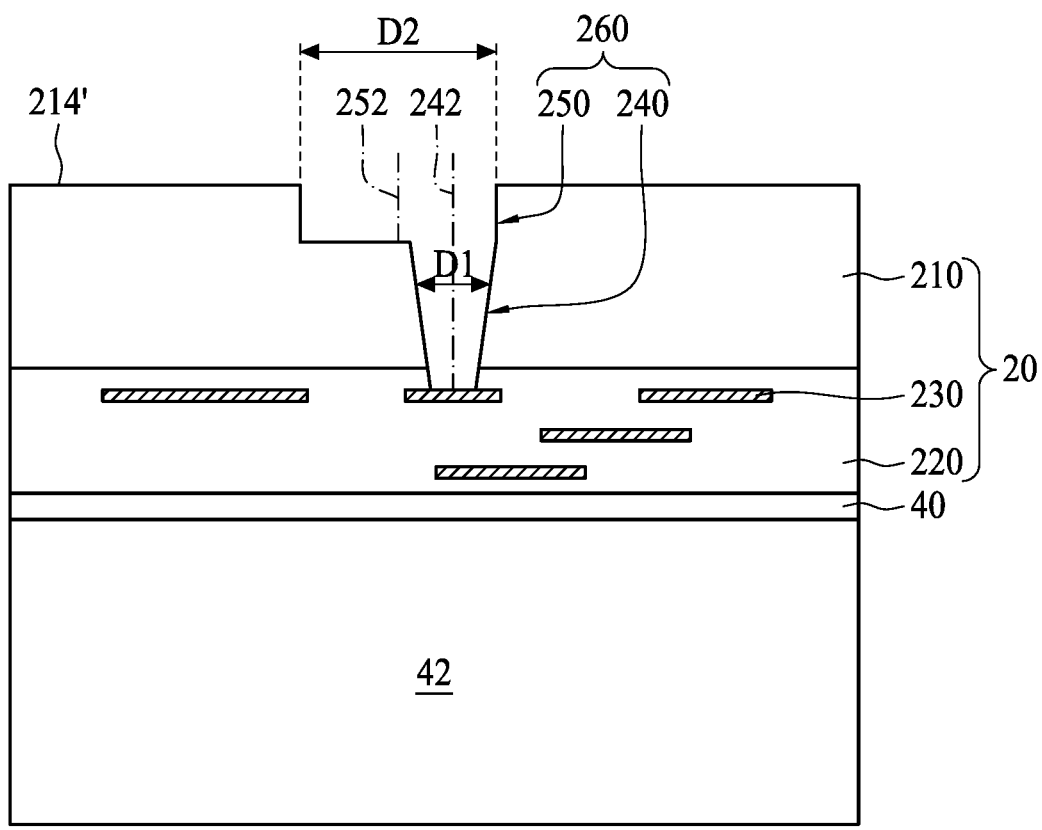

Referring to FIGS. 9 and 10, in some embodiments, a second opening 250 communicating with the first opening 240 is formed according to a step 512 in FIG. 2. In some embodiments, the second opening 250 is formed by coating a second photoresist pattern 64 on the first back surface 214' and performing a second etching process to remove a portion of the first substrate 210. In some embodiments, the first opening 240 and a portion of the first back surface 214' are exposed through the second photoresist pattern 64. In some embodiments, the first opening 240 and the second opening 250 constitute a stepped hole 260. In some embodiments, the first opening 240 has a diameter D1 that gradually decreases at positions of increasing distance from the first back surface 214'. In some embodiments, the second opening 250 has a substantially consistent diameter D2, which is greater than the diameter D1 of the first opening 240. In some embodiments, the first opening 240 has a central line 242, and the second opening 250 has a central line 252 that is offset from the central line 242. After the second etching process, the second photoresist pattern 64 is removed, for example, by an ashing process or a wet strip process.

Figure 11:
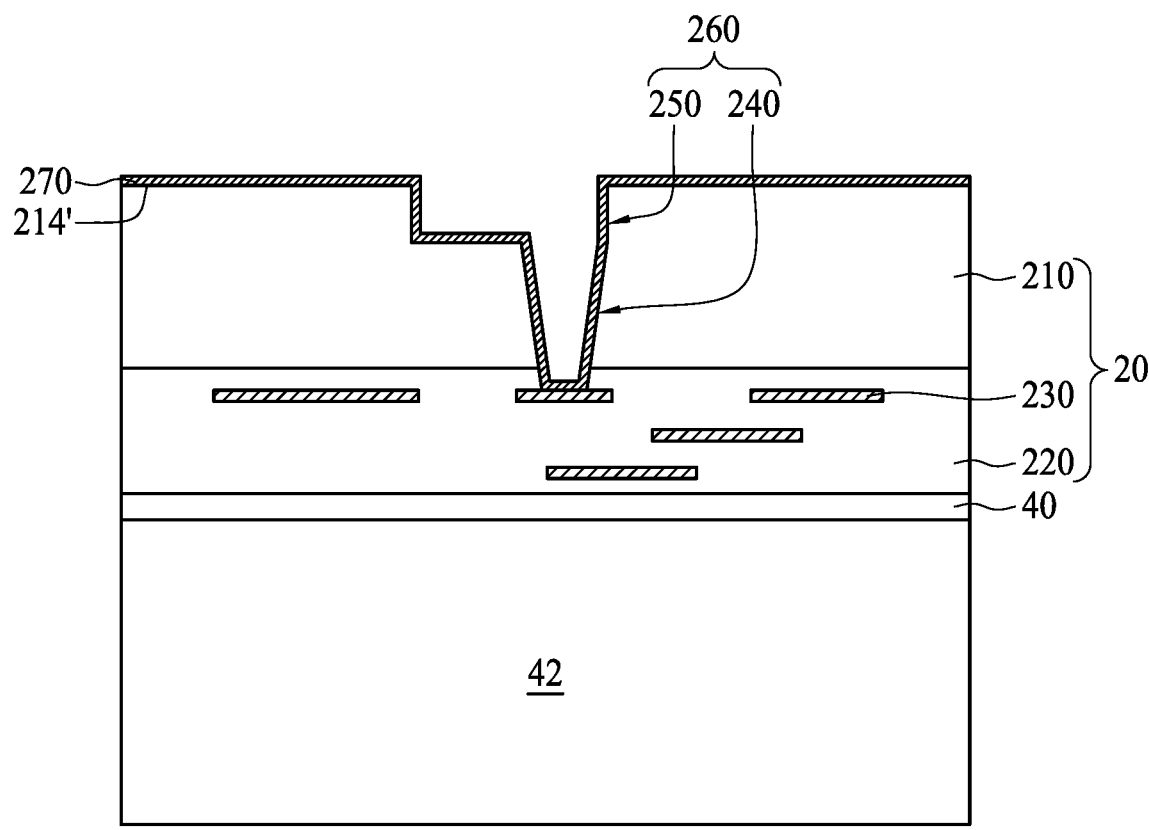

Referring to FIG. 11, in some embodiments, a first insulating layer 270 is deposited on the first back surface 214' and in the stepped hole 260 according to a step 514 in FIG. 2. In the resulting structure, the first conductor 230 exposed through the stepped hole 260 is covered by the first insulating layer 270. In some embodiments, the first insulating layer 270 is a substantially conformal layer. In some embodiments, the first insulating layer 270 includes oxide such as silicon oxide. In some embodiments, the first insulating layer 270 may be formed by a high-density plasma CVD process.

Figure 12:
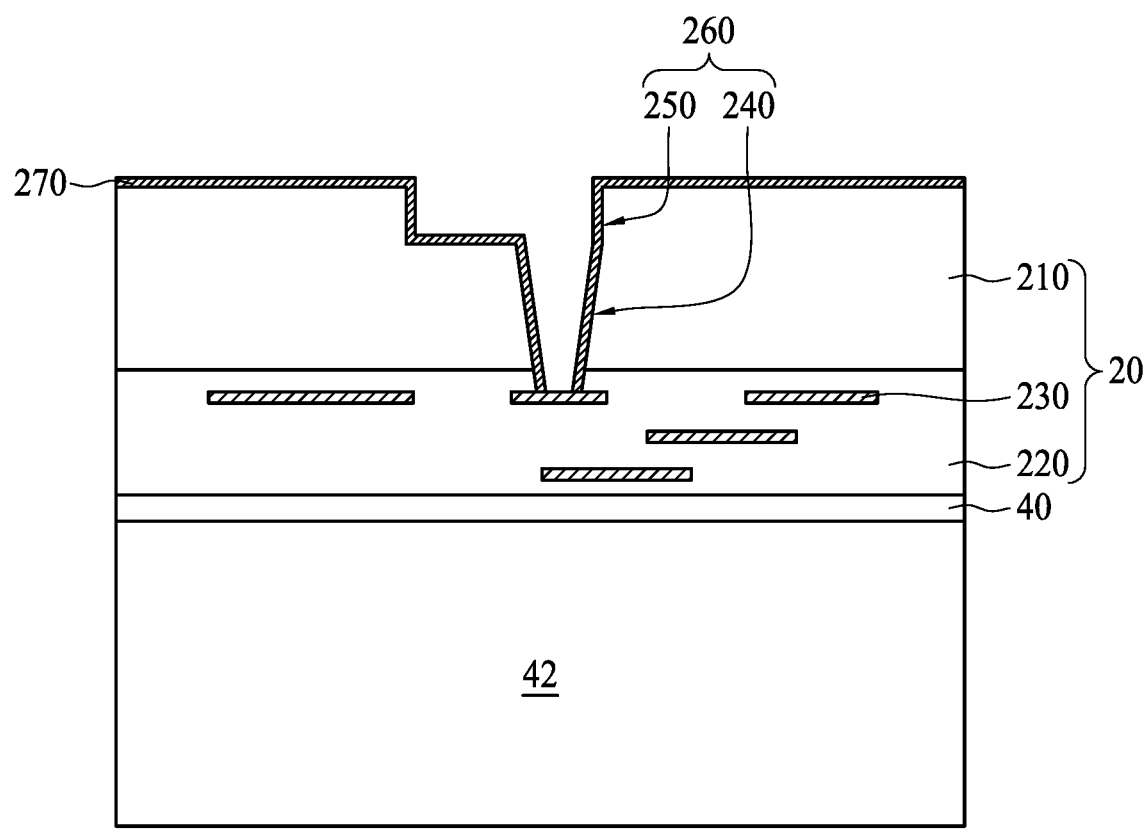

Next, a portion of the first insulating layer 270 is removed to expose the first conductor 230, as shown in FIG. 12. In some embodiments, the portion of the first insulating layer 270 is removed by a suitable process, such as an etching process.

Figure 13:
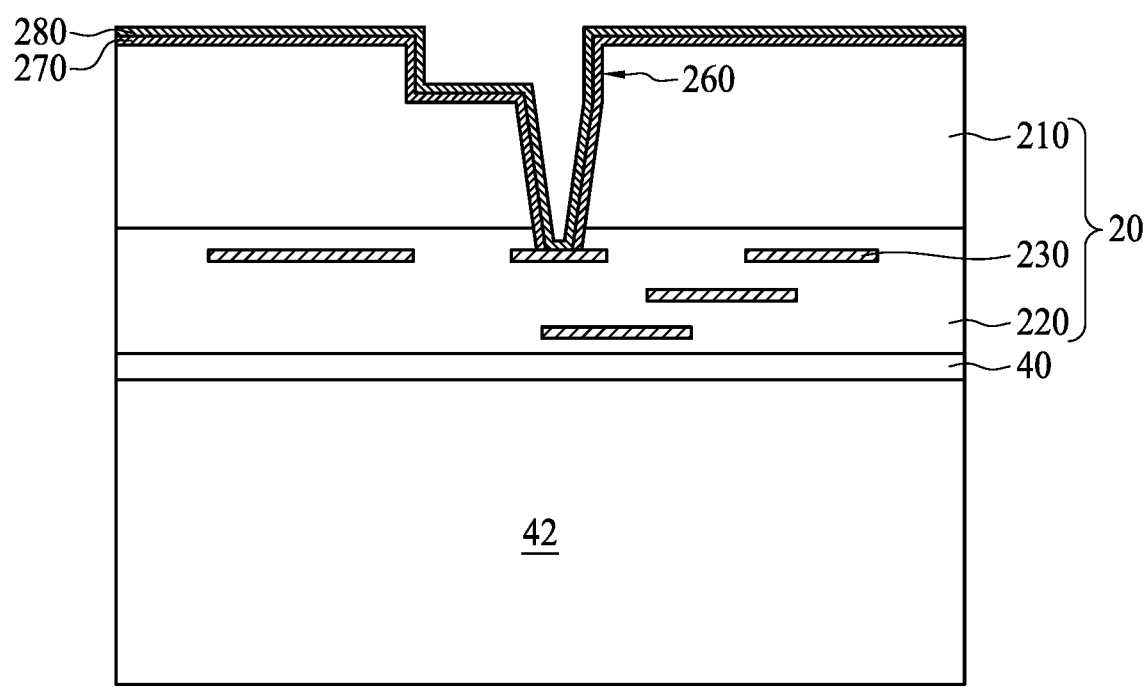

Referring to FIG. 13, in some embodiments, a first barrier layer 280 is optionally deposited on the first insulating layer 270 and the first conductor 230 according to a step 516 in FIG. 2. In some embodiments, the first barrier layer 280 is a substantially conformal layer. In some embodiments, the first barrier layer 280 may be a single-layered structure including refractory metals, refractory metal nitrides or refractory metal silicon nitrides. In some embodiments, the first barrier layer 280 may have a multi-layered structure including one or more refractory metals, refractory metal nitrides or refractory metal silicon nitrides. In some embodiments, the first barrier layer 280 is formed using a physical vapor deposition (PVD) process or an atomic layer deposition process, for example.

Figure 14:
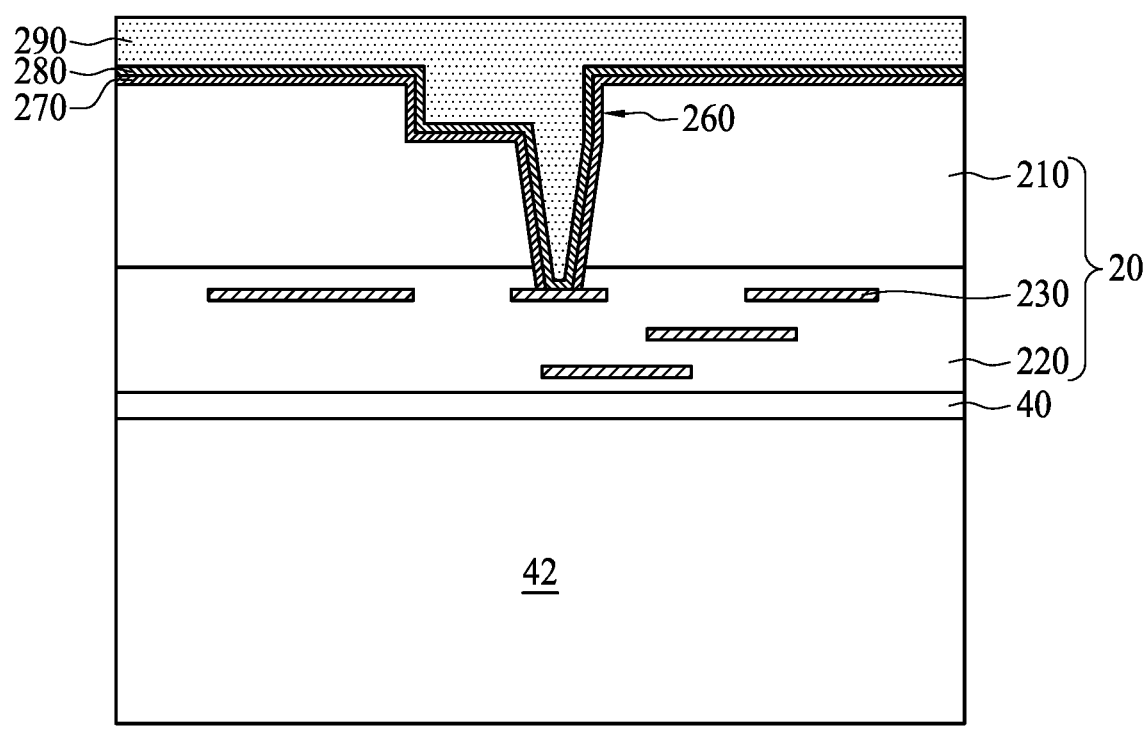

Referring to FIG. 14, a first metallic material 290 is deposited on the first barrier layer 280 according to a step 518 in FIG. 2. In some embodiments, the first metallic material 290 has a thickness sufficient to fill the stepped hole 260. In some embodiments, the first metallic material 290 is formed by a plating process.

Figure 15:
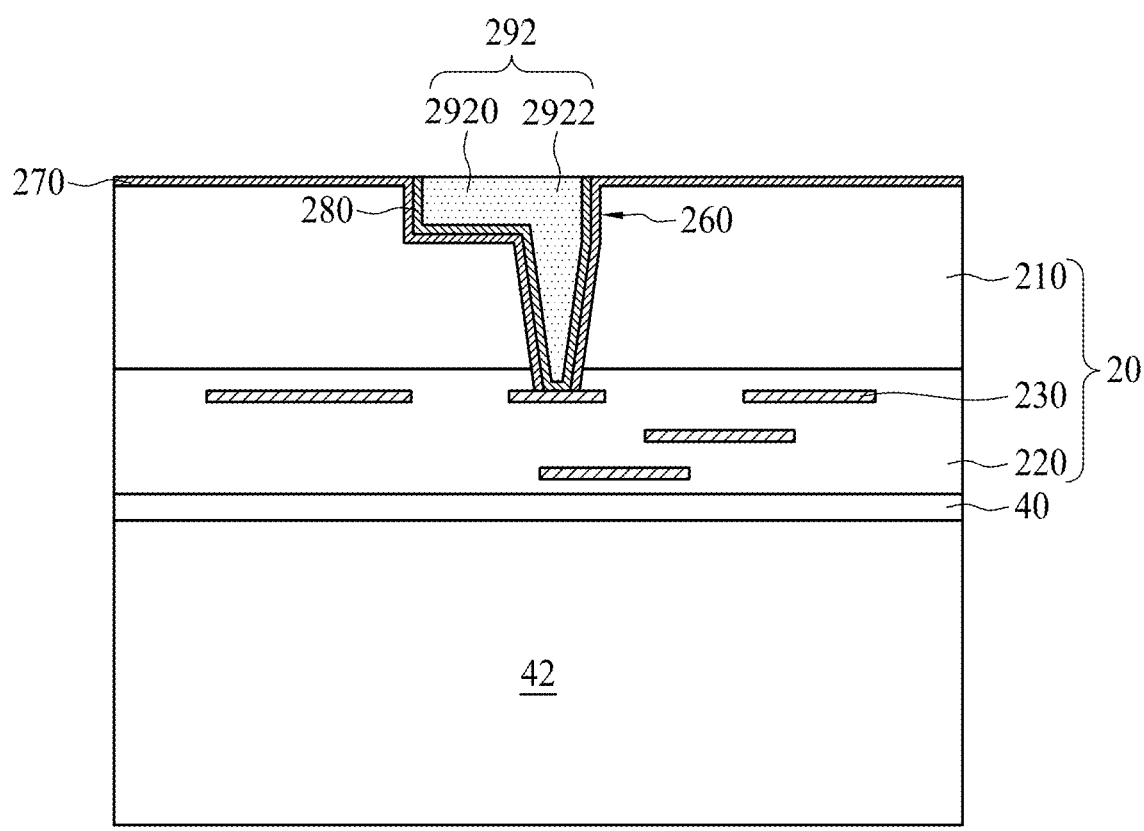

Referring to FIG. 15, in some embodiments, a first planarizing process is performed to expose the first insulating layer 270 according to a step 520 in FIG. 2. Accordingly, a first interconnect structure 292 is formed. In some embodiments, the first metallic material 290 and the first barrier layer 280 are planarized to expose the first insulating layer 270. In some embodiments, the first planarizing process includes a chemical mechanical polishing (CMP) process.

Figure 16:
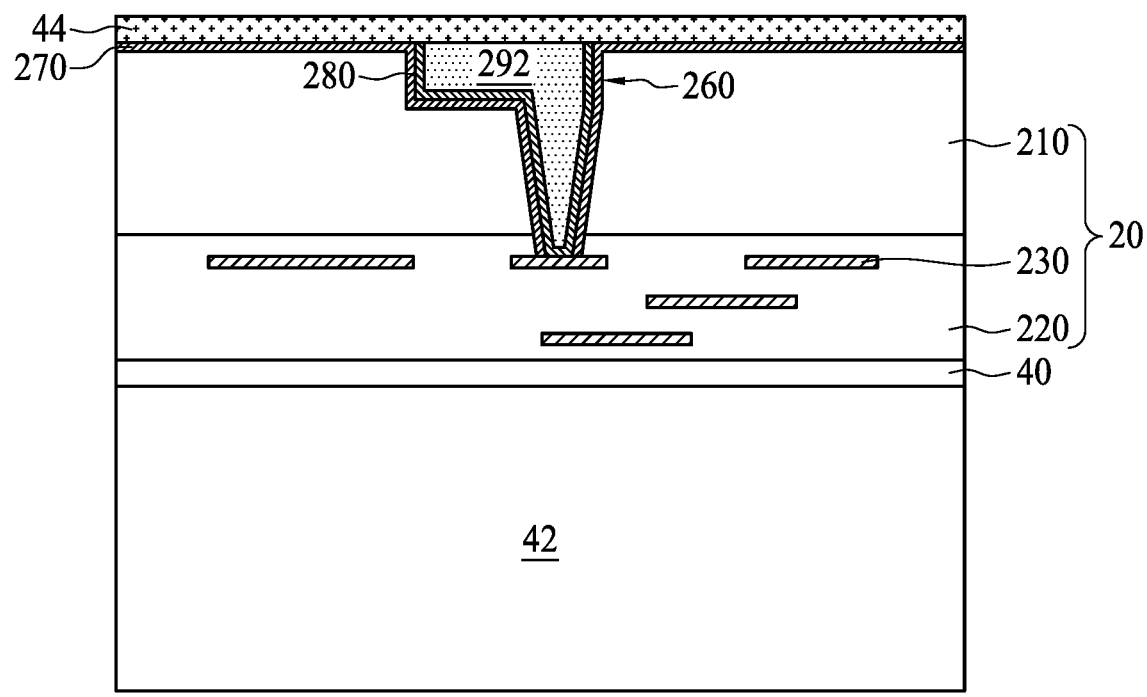

Referring to FIG. 16, in some embodiments, a bonding dielectric 44 is deposited on the first insulating layer 270, the first barrier layer 280 and the first interconnect structure 292 according to a step 522 in FIG. 2. In some embodiments, the bonding dielectric 44 includes oxide, such as silicon oxide. In some embodiments, the bonding dielectric 44 is formed in a manner similar to that used to form the bonding layer 40.

Figure 17:
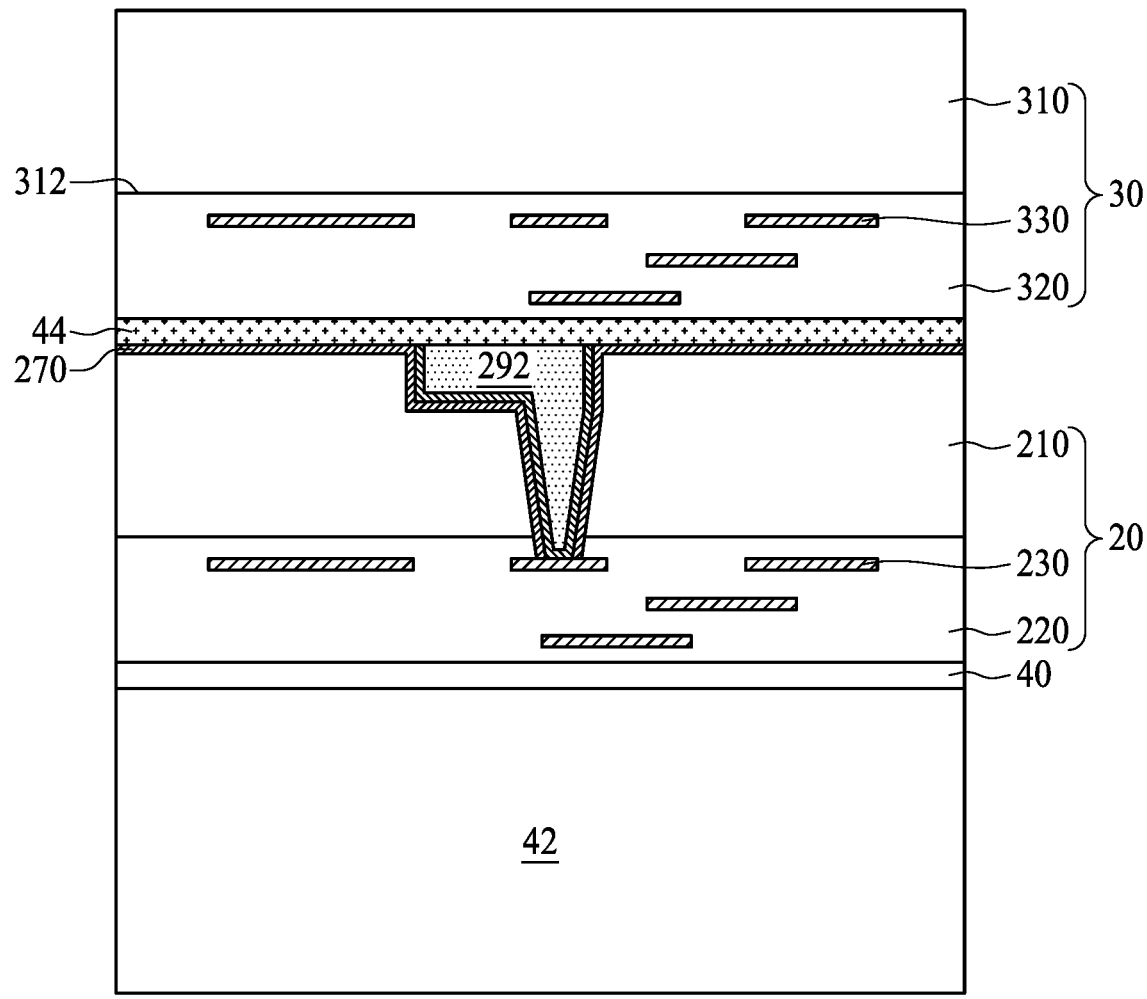

Referring to FIG. 17, in some embodiments, a second wafer 30 is provided and bonded on the first wafer 20 using the bonding dielectric 44 according to a step 524 in FIG. 2. In some embodiments, the second wafer 30 is bonded on the first wafer 20 by a dielectric-to-dielectric bonding process. In some embodiments, the second wafer 30 includes a second substrate 310, a second ILD layer 320 disposed on a second front surface 312 of the second substrate 310, and a plurality of second contacts 330 in the second ILD layer 320. After the second wafer 30 is bonded to the first wafer 20, the second wafer 30 is stacked on the first wafer 20, and the second ILD layer 320 is in contact with the bonding dielectric 44.

Figure 18:
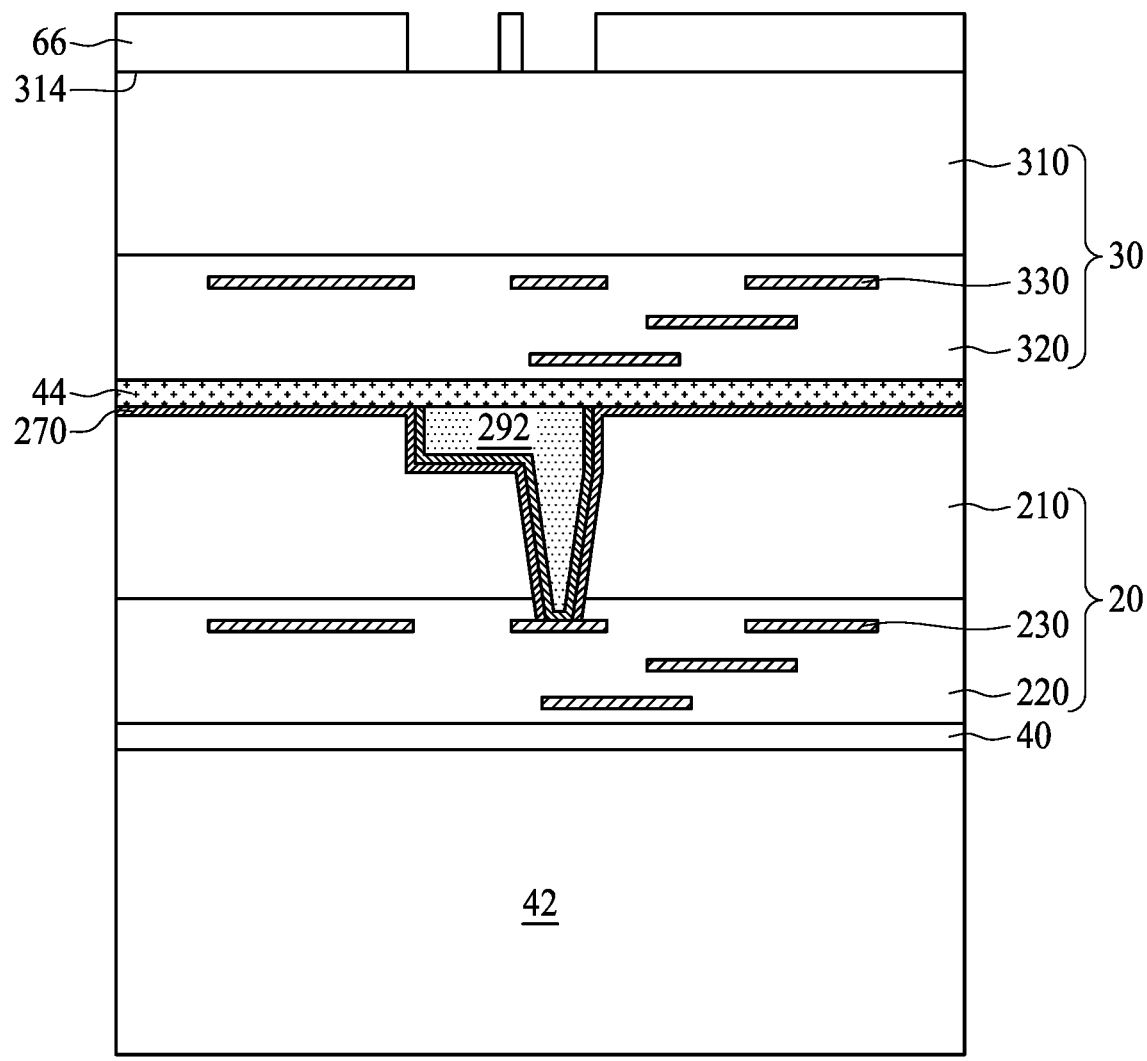
Figure 19:
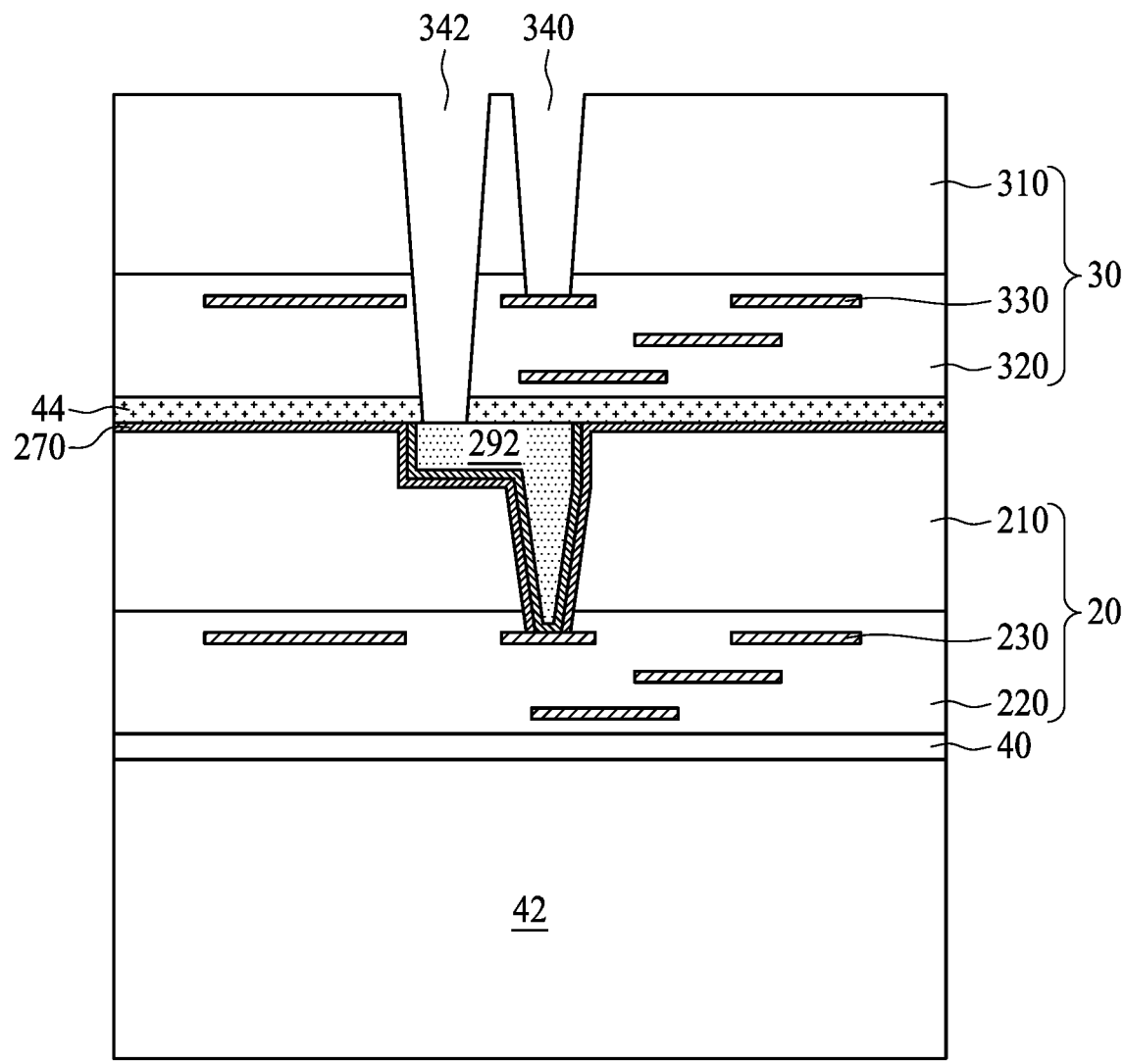

Referring to FIGS. 18 and 19, in some embodiments, a first trench 340 is formed to expose one of the second contacts 330 and a second trench 342 is formed to expose the first interconnect structure 292 according to a step 526 in FIG. 2. In some embodiments, the first trench 340 and the second trench 342 are formed using photolithography techniques. In further detail, the photolithography techniques involve depositing a photoresist material 66, which is subsequently irradiated (exposed) and developed to remove a portion of the photoresist material 66, on the second back surface 314. The remaining photoresist material 66 protects the underlying second substrate 310 during subsequent etching processes. The etching processes, such as a reactive ion beam etch (RIE) process, are performed to remove portions of the second substrate 310 and the second ILD layer 320 that overlie the one of the second contacts 330 and the first interconnect structure 292. The remaining photoresist material 66 is then removed, for example, by an ashing process or a wet strip process.

Figure 20:
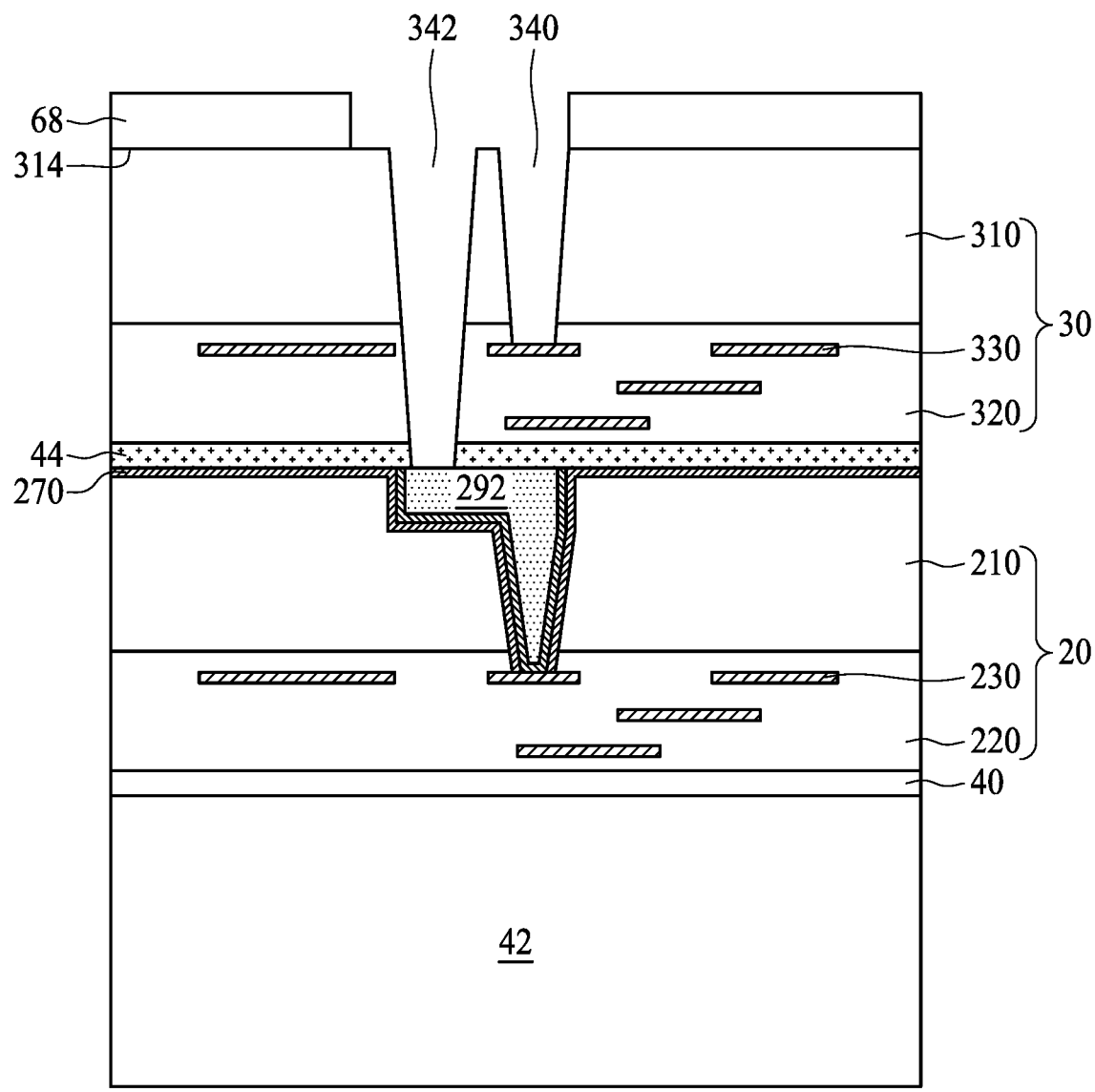
Figure 21:
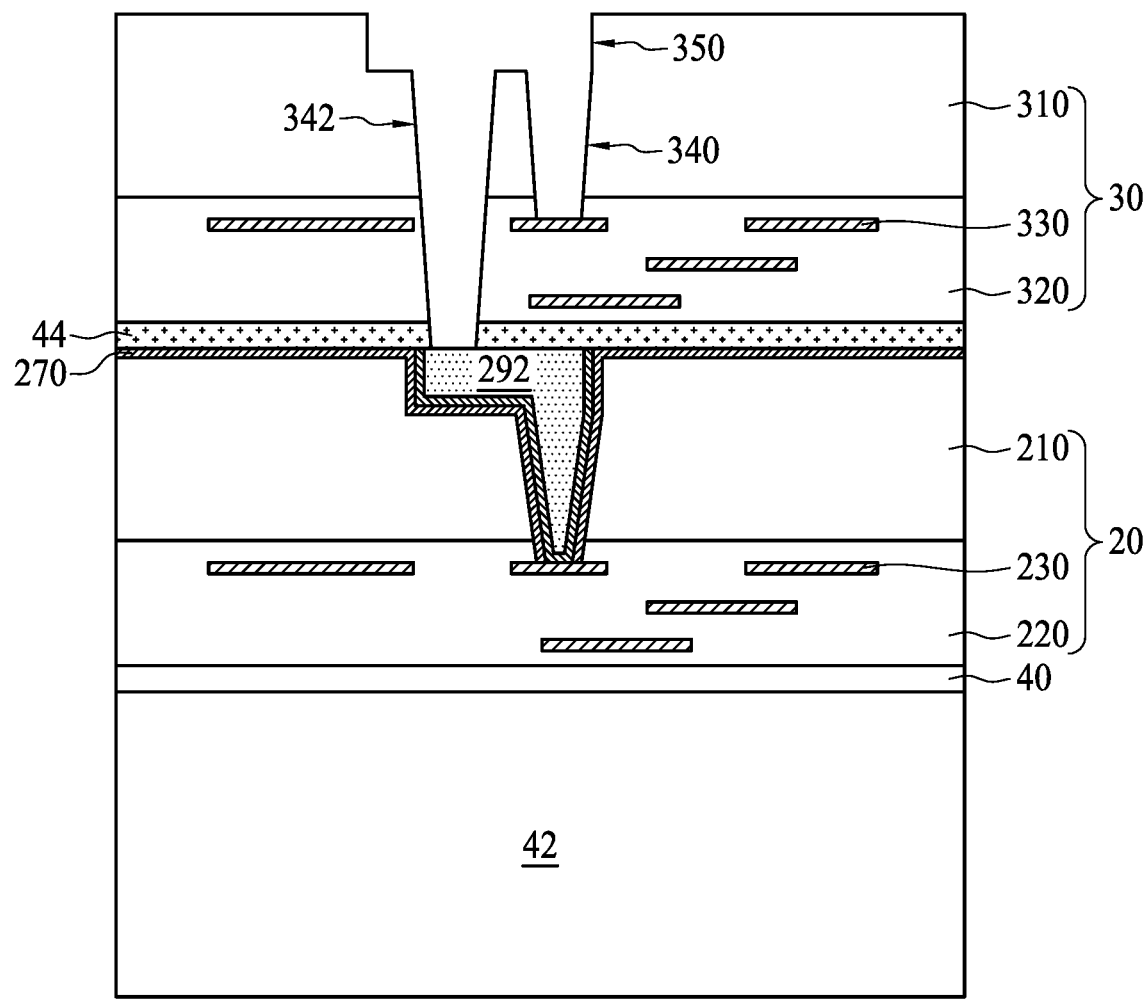

Referring to FIGS. 20 and 21, in some embodiments, a recess 350 communicating with the first trench 340 and the second trench 342 is formed in the second substrate 310 according to a step 528 in FIG. 2. In some embodiments, the recess 350 may be formed, for example, using photolithography techniques to deposit and pattern a photoresist material 68 on the second back surface 314 to expose portions of the second back surface 314, the first trench 340 and the second trench 342. An etching process, such as an anisotropic dry etch process, may be used to create the recess 350 in the second substrate 310. The material 68 is then removed, for example, by an ashing process or a wet strip process.

Figure 22:
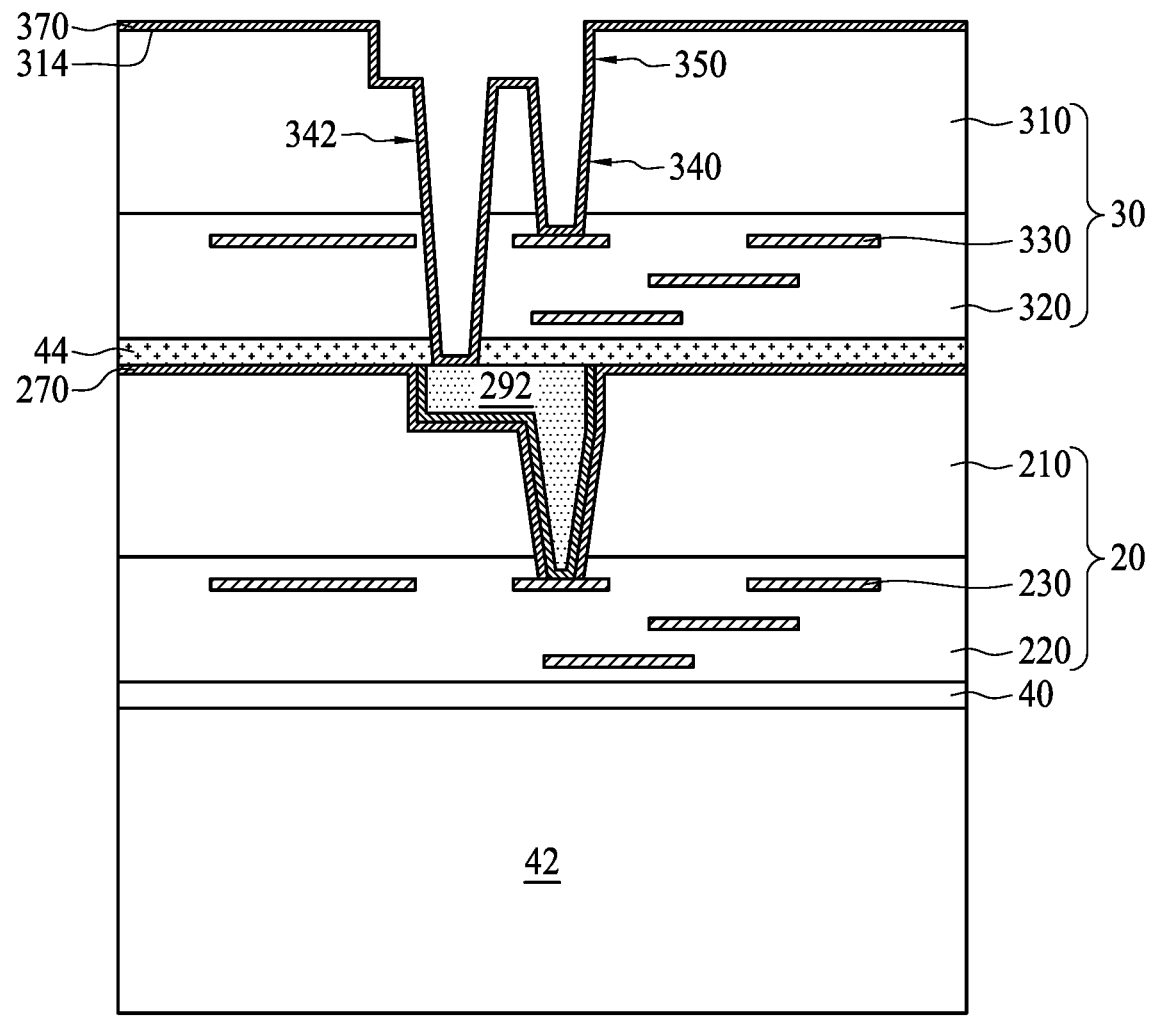

Referring to FIG. 22, in some embodiments, a substantially conformal second insulating layer 370 is deposited on the second back surface 314 and in the first trench 340, the second trench 342 and the recess 350 according to a step 530 in FIG. 2. In some embodiments, the second insulating layer 370 is formed in a manner similar to that used to form the first insulating layer 270.

Figure 23:
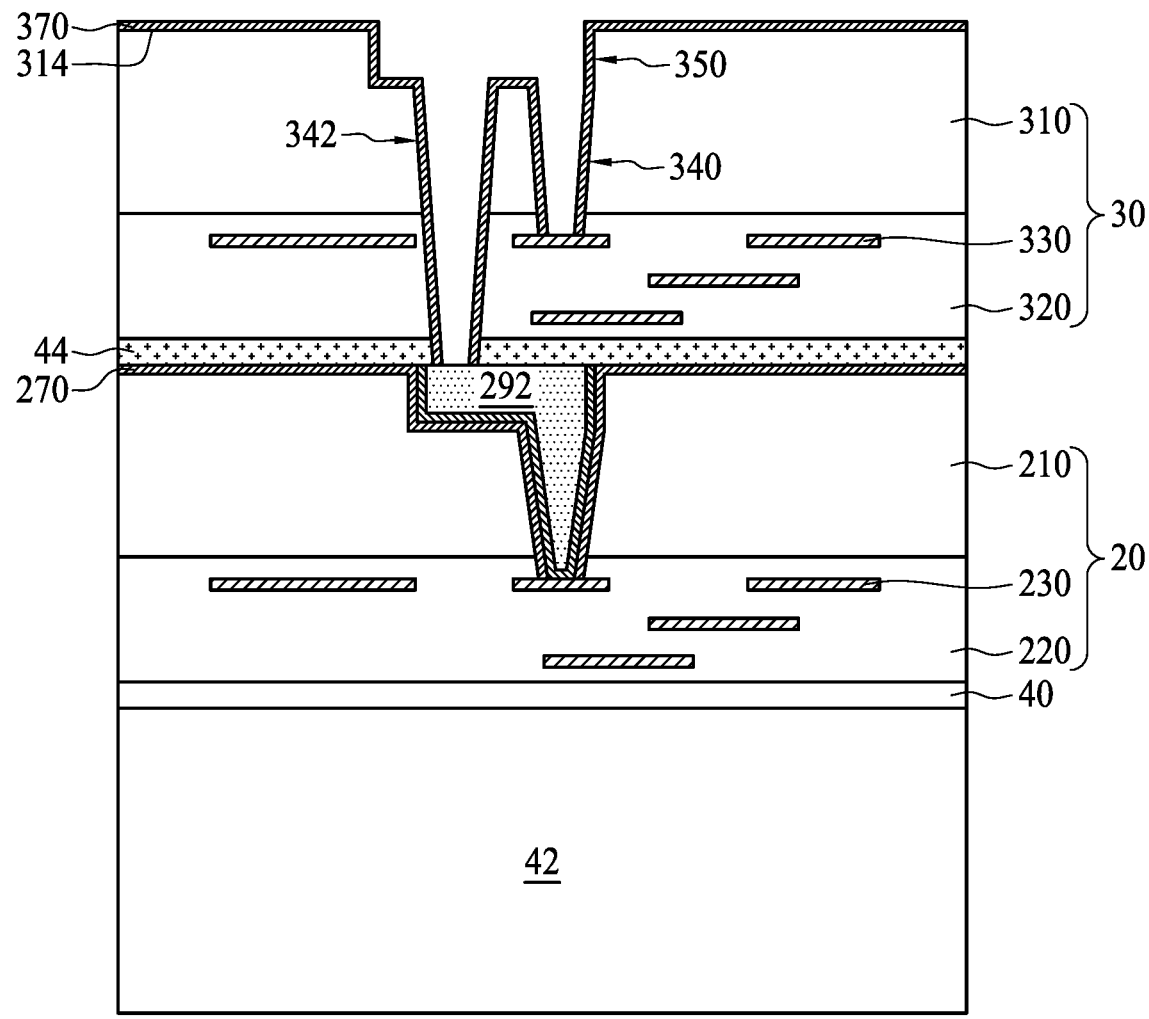

Referring to FIG. 23, portions of the second insulating layer 370 deposited on the first interconnect structure 292 and the second conductor 330 are removed by a suitable process, such as an etching process.

Figure 24:
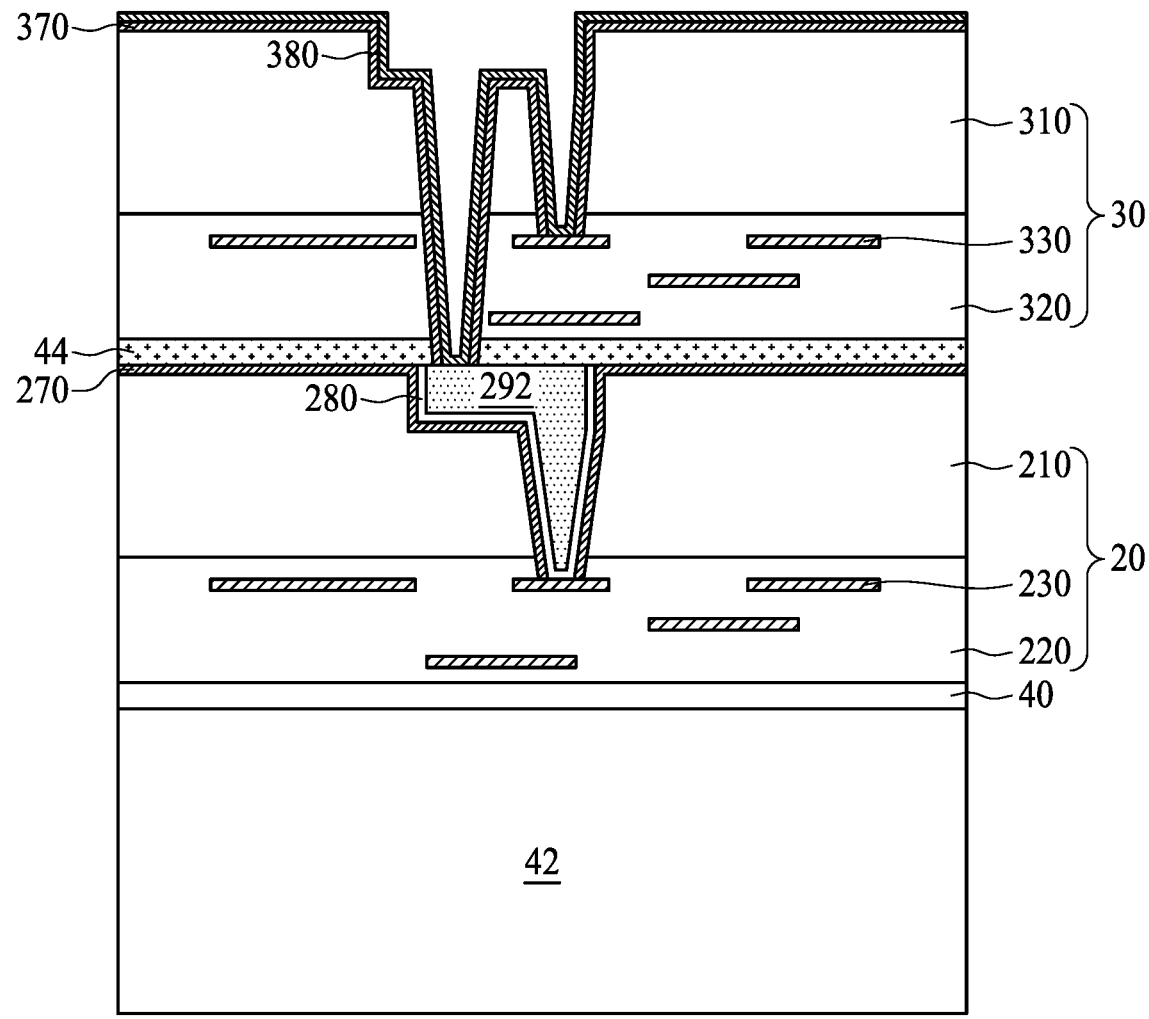

Referring to FIG. 24, in some embodiments, a substantially conformal second barrier layer 380 is optionally deposited on the first interconnect structure 292, the second conductor 330, and the second insulating layer 370 according to a step 532 in FIG. 2. In some embodiments, the second barrier layer 380 is formed in a manner similar to that used to form the first barrier layer 280.

Figure 25:
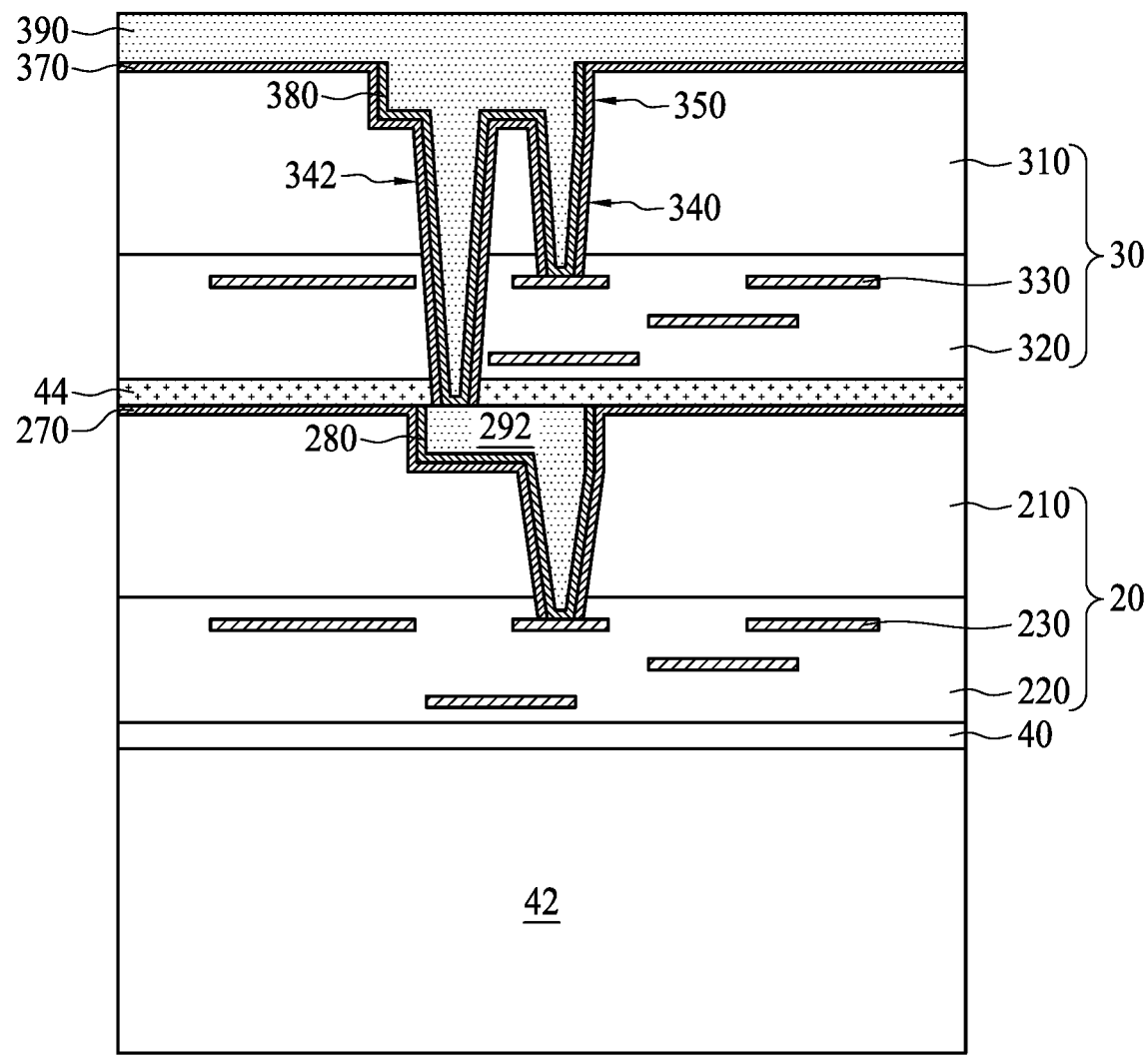

Referring to FIG. 25, a second metallic material 390 is deposited on the second barrier layer 380 according to a step 534 in FIG. 2. In some embodiments, the second metallic material 390 has a thickness sufficient to fill the first trench 340, the second trench 342 and the recess 350. In some embodiments, the second metallic material 390 is formed in a manner similar to that used to form the first metallic material 290.

Figure 26:
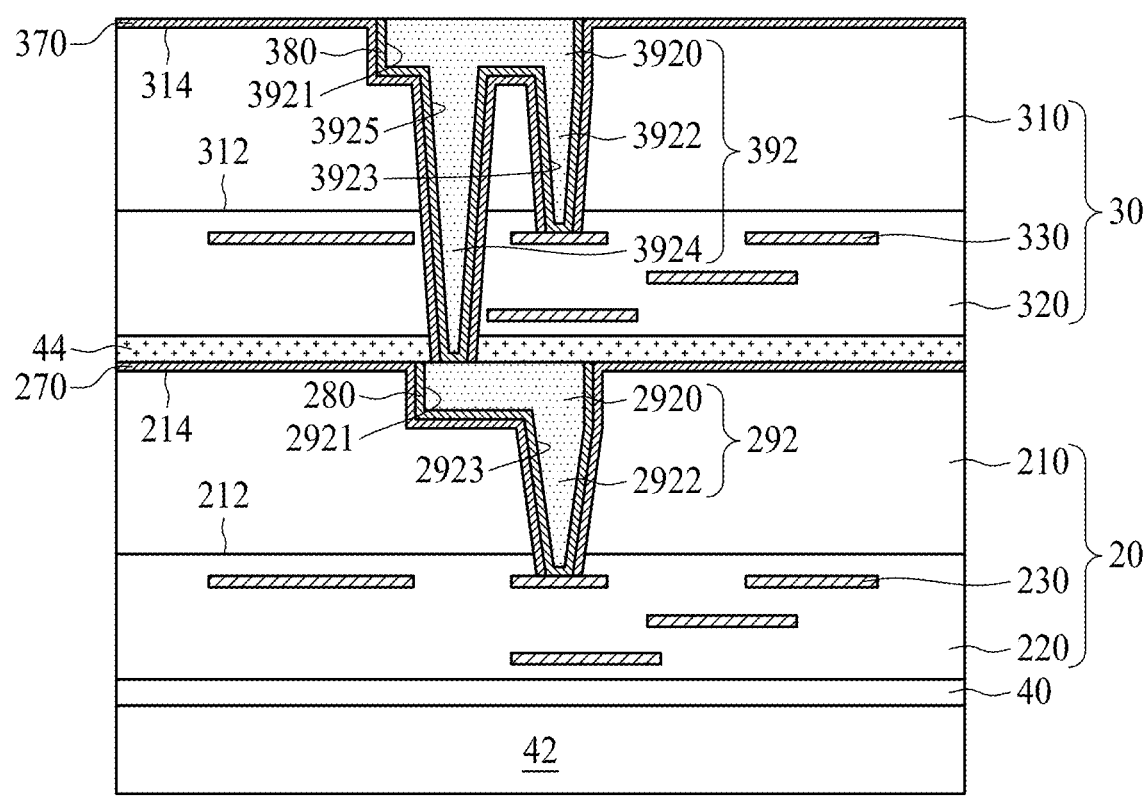

Referring to FIG. 26, in some embodiments, a second planarizing process is performed to expose the second insulating layer 370 according to a step 536 in FIG. 2. Accordingly, a second is interconnect structure 392 is formed. In some embodiments, the second metallic material 390 and the second barrier layer 380 are planarized to expose the second insulating layer 370.

Figure 27:
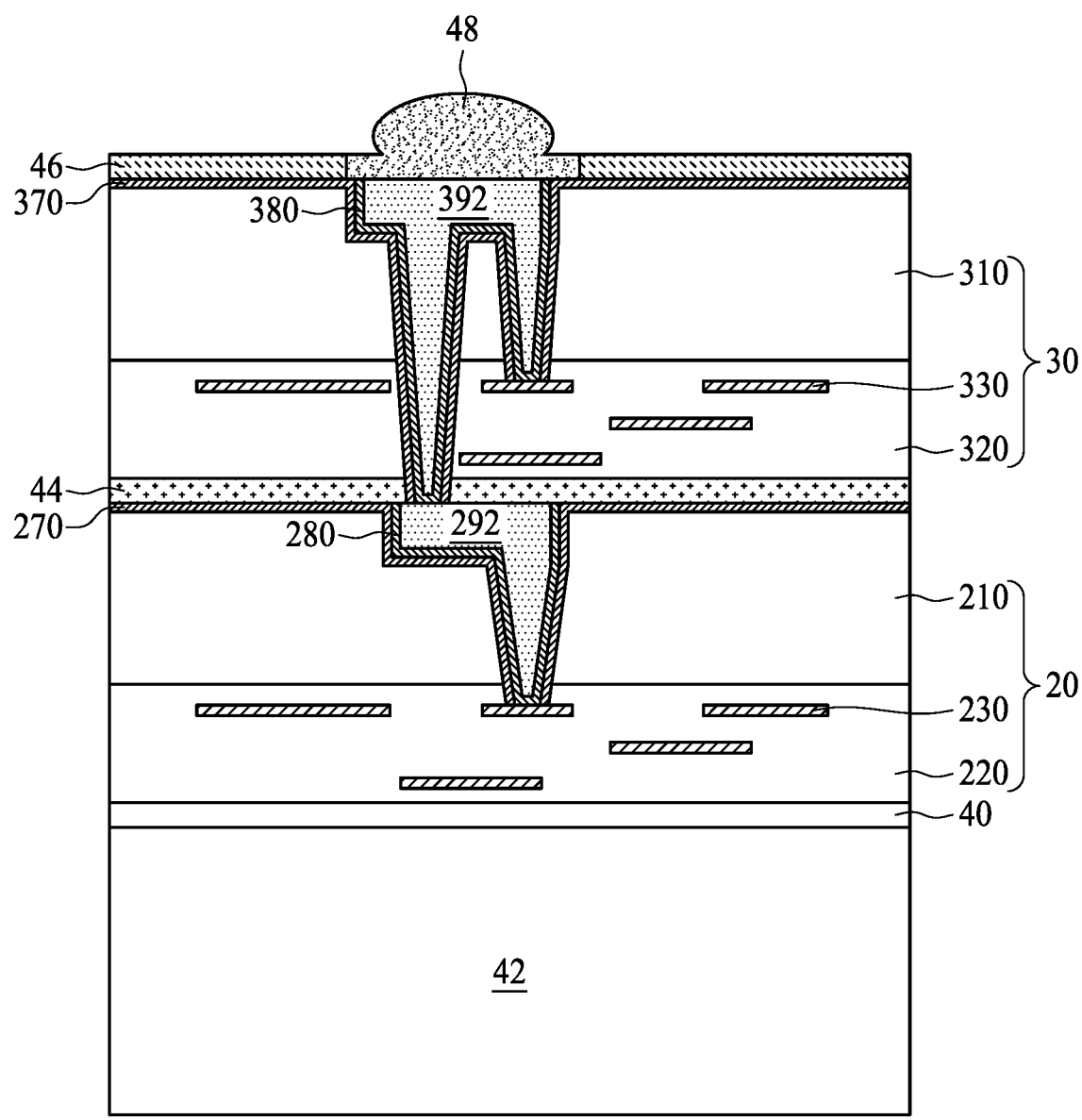

Referring to FIG. 27, one or more additional isolating layers 46 are formed on the second insulating layer 270 and one or more external contacts 48 are formed on the second interconnect structure 392 according to a step 538 in FIG. 2. In some embodiments, the external contacts 48 are used to transmit input/output (I/O), ground or power signals of the first wafer 20 and the second wafer 30.

Figure 28:
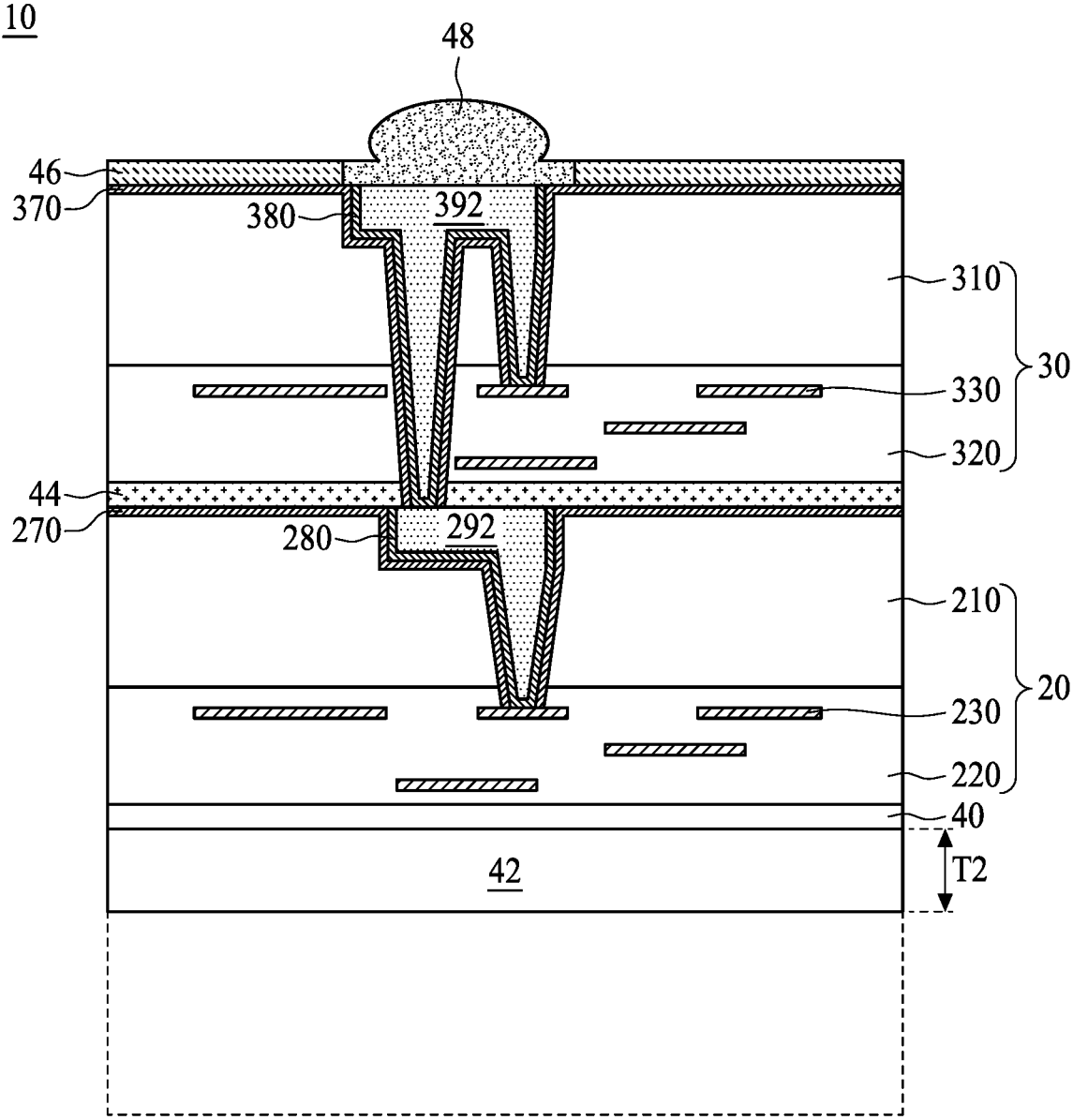

Referring to FIG. 28, a grinding process is performed to thin the carrier wafer 42 according to a step 540 in FIG. 2. Accordingly, the semiconductor device 10 is completely formed. In some embodiments, the carrier wafer 42 is thinned to a thickness T2, such as less than or equal to about 50 μm.

One aspect of the present disclosure provides a method of manufacturing a semiconductor device. The method includes steps of providing a first wafer comprising a first substrate, a first inter-layer dielectric (ILD) layer disposed on a first front surface of the first substrate, and a plurality of first conductors disposed in the first ILD layer; forming a first interconnect structure penetrating through the first substrate and into the first ILD layer and contacting one of the first conductors; forming a bonding dielectric on a first back surface opposite to the first front surface and on the first interconnect structure; bonding a second wafer on the first wafer, wherein the second wafer comprises a second substrate, a second ILD layer disposed on a second front surface of the second substrate, and a plurality of second conductors disposed in the second ILD layer, wherein the second ILD is layer is in contact with the bonding dielectric; forming a second interconnect structure penetrating through the second substrate and into the second ILD layer and contacting one of the plurality of second conductors and the first interconnect structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A method of manufacturing a semiconductor device, comprising:
    providing a first wafer comprising a first substrate, a first inter-layer dielectric (ILD) layer disposed on a first front surface of the first substrate, and a plurality of first conductors disposed in the first ILD layer;
    forming a first interconnect structure penetrating through the first substrate and into the first ILD layer and contacting one of the plurality of the first conductors;
    forming a bonding dielectric on a first back surface of the first substrate opposite to the first front surface of the first substrate and on the first interconnect structure;
    bonding a second wafer on the first wafer, wherein the second wafer comprises a second substrate, a second ILD layer disposed on a second front surface of the second substrate, and a plurality of second conductors disposed in the second ILD layer, wherein the second ILD layer is in contact with the bonding dielectric;
    forming a second interconnect structure including a first leg penetrating through the second substrate and into the second ILD layer to contact one of the plurality of second conductors, and a second leg penetrating through the second substrate, the second ILD layer and the bonding dielectric to contact the first interconnect structure.

2. The method of claim 1, wherein the forming of the first interconnect structure comprises:
    forming a first opening penetrating through the first substrate and into the first ILD layer to expose the one of the plurality of first conductors; and
    depositing a first metallic material in the first opening.

3. The method of claim 2, wherein the forming of the second interconnect structure comprises:
    forming a first trench penetrating through the second substrate, the second ILD layer and the bonding dielectric to expose the first metallic material;
    forming a second trench penetrating through the second substrate and into the second ILD layer to expose one of the plurality of second conductors;
    forming a recess communicating with the first trench and the second trench; and
    depositing a second metallic material in the first trench, the second trench and the recess.

4. The method of claim 3, further comprising:
    depositing a first insulating layer along the first back surface and the first opening before the deposition of the first metallic material;
    removing a portion of the first insulating layer to expose the one of the plurality of first conductors;
    depositing a second insulating layer along a second back surface of the second substrate, the recess, the first trench, and the second trench before the deposition of the second metallic material; and
    removing portions of the second insulating layer to expose the one of the plurality of second conductors and the first metallic material.

5. The method of claim 4, further comprising:
    depositing a first barrier layer on the first insulator and the one of the plurality of first conductors before the deposition of the first metallic material; and
    depositing a second barrier layer on the second insulating layer and the one of the plurality of second conductors before the deposition of the second metallic material.

6. The method of claim 5, further comprising:
  performing a first planarizing process to remove portions of the first metallic material and the first barrier layer above the first insulating layer; and
  performing a second planarizing process to remove portions of the second metallic material and the second barrier layer above the second insulating layer.

7. The method of claim 2, wherein the forming of the first interconnect structure further comprises:
  forming a second opening communicating with the first opening in the first substrate before the deposition of the first metallic material; and
  depositing the first metallic material in the second opening.

8. The method of claim 7, wherein the second opening has a substantially consistent diameter, and the first opening has a diameter, which gradually decreases at positions of increasing distance from the first back surface, wherein the diameter of the first opening is less than the diameter of the second opening.

9. The method of claim 8, wherein the first opening has a central line, which is offset from a central line of the second opening.

10. The method of claim 1, further comprising:
  depositing a passivation layer over a second back surface of the second substrate; and
  forming an external contact in contact with the second interconnect structure.

11. The method of claim 1, further comprising:
  providing a carrier wafer before providing the first wafer;
  forming a bonding layer on the carrier wafer; and
  bonding the first wafer on the carrier wafer, wherein the first ILD layer is in contact with the bonding layer.

12. The method of claim 11, further comprising thinning the first substrate after the bonding of the first wafer to the carrier wafer.

13. The method of claim 12, further comprising grinding the carrier wafer after the forming of the second interconnect structure.

14. The method of claim 1, wherein the first interconnect structure comprises:
  a mesa; and
  a protrusion extending from the mesa and contacting the one of the plurality of first conductors.

15. The method of claim 1, wherein the second interconnect structure comprises:
  a base;
  wherein the first leg extending from the base and contacting the one of the plurality of second conductors, and the second leg extending from the base and contacting the first interconnect structure.

* * * * *